US009127987B2

(12) United States Patent
Leung et al.

(10) Patent No.: US 9,127,987 B2
(45) Date of Patent: Sep. 8, 2015

(54) CHANNEL, SYSTEM AND METHOD FOR MONITORING VOLTAGES

(75) Inventors: Henry Hon-Yiu Leung, Coquitlam (CA); Mathieu Garret Schneider, Vancouver (CA); Mehdi Sadaghdar, Vancouver (CA); Steven Scott Kazemir, Port Coquitlam (CA); Derek John Pyner, Delta (CA); Mark Randall Olfert, Surrey (CA); Steve Zu-Ching Wu, Burnaby (CA)

(73) Assignee: Greenlight Innovation Corporation, Burnaby, British Columbia (CA)

( * ) Notice: Subject to any disclaimer, the term of this patent is extended or adjusted under 35 U.S.C. 154(b) by 800 days.

(21) Appl. No.: 13/381,033

(22) PCT Filed: Jun. 30, 2010

(86) PCT No.: PCT/CA2010/001021

§ 371 (c)(1),
(2), (4) Date: Dec. 27, 2011

(87) PCT Pub. No.: WO2011/000101

PCT Pub. Date: Jan. 6, 2011

(65) Prior Publication Data

US 2012/0101756 A1 Apr. 26, 2012

Related U.S. Application Data

(60) Provisional application No. 61/221,870, filed on Jun. 30, 2009.

(51) Int. Cl.
*G01R 19/00* (2006.01)
*G01K 7/13* (2006.01)
(Continued)

(52) U.S. Cl.
CPC *G01K 7/13* (2013.01); *G01K 1/026* (2013.01); *G01K 7/021* (2013.01); *G01R 31/3658* (2013.01)

(58) Field of Classification Search
CPC .................................................. G01R 31/3658
See application file for complete search history.

(56) References Cited

U.S. PATENT DOCUMENTS

| | | | |
|---|---|---|---|
| 5,170,124 | A | 12/1992 | Blair et al. |
| 5,652,501 | A | 7/1997 | McClure et al. |

(Continued)

FOREIGN PATENT DOCUMENTS

| | | | |
|---|---|---|---|
| WO | WO01/14898 A1 | 3/2001 | |
| WO | WO2005/069026 A1 | 7/2005 | |
| WO | WO2006/096958 A1 | 9/2006 | |

OTHER PUBLICATIONS

International Search Report and Written Opinion of the International Searching Authority, mailed Aug. 12, 2010, for corresponding International Application No. PCT/CA2010/001021, 9 pages.

(Continued)

*Primary Examiner* — Timothy H Hwang
(74) *Attorney, Agent, or Firm* — Klarquist Sparkman, LLP

(57) ABSTRACT

Described herein are a channel, system and method for monitoring voltages. Typically, the system includes multiple channels, each for sampling one of the voltages. The channels are physically and electrically coupled to a back end board on which is mounted a field programmable gate array (FPGA) that instructs the channels to simultaneously sample the voltages. Optionally, the channel is powered using an power supply that is isolated from the back end board, and transmits information over an electrically isolated connection to the back end board. The channel also includes voltage signal processing circuitry for processing the voltage signal on board the channel, and has stored on it channel identification information composed of at least one of an operating mode of the channel and a serial number of the channel, which can assist with voltage signal processing.

32 Claims, 11 Drawing Sheets

(51) Int. Cl.

| | |
|---|---|
| ***G01K 1/02*** | (2006.01) |
| ***G01K 7/02*** | (2006.01) |
| ***G01R 31/36*** | (2006.01) |

(56) References Cited

U.S. PATENT DOCUMENTS

| | | | | |
|---|---|---|---|---|
| 5,763,113 | A | 6/1998 | Meltser et al. | |
| 5,808,469 | A | 9/1998 | Kopera | |
| 5,914,606 | A | 6/1999 | Becker-Irvin | |
| 5,914,609 | A | 6/1999 | Curry et al. | |
| 6,094,053 | A * | 7/2000 | Harvey | 324/434 |
| 6,268,710 | B1 * | 7/2001 | Koga | 320/116 |
| 6,313,750 | B1 | 11/2001 | Lacy | |
| 6,406,806 | B1 | 6/2002 | Keskula et al. | |
| 7,453,235 | B2 * | 11/2008 | Blair et al. | 320/116 |
| 8,428,896 | B2 * | 4/2013 | Iwasaki et al. | 702/63 |
| 2005/0162129 | A1 * | 7/2005 | Mutabdzija et al. | 320/116 |
| 2008/0231257 | A1 | 9/2008 | Williams | |
| 2008/0278172 | A1 | 11/2008 | Miyamoto | |
| 2009/0009178 | A1 * | 1/2009 | Okamoto et al. | 324/434 |
| 2009/0013258 | A1 * | 1/2009 | Hintermeister et al. | 715/736 |

OTHER PUBLICATIONS

FuelCon, "TrueData—CVM," printed May 31, 2009, 2 pages.

GRandalytics, Software Development for Measurement and Automation, www.grandalytics.com/products.htm, printed Mar. 6, 2009, 6 pages.

National Semiconductor Corporation, "Automotive Hybrid Electric Vehicle Battery Stack Voltage Monitoring System," printed May 31, 2009, 1 page.

Scribner Associates Inc., "896 Stack Monitor System," printed May 31, 2009, 1 page.

Smart Electronic Development GmbH, "Multichannel Measurement and Monitoring for Fuel Cells, Electrolysis and High Caps," printed May 31, 2009, 2 pages.

Vito NV, "CellSense FC On-site Cell Voltage Monitoring for Fuel Cell Stack Control and Diagnosis," printed May 31, 2009, 2 pages.

* cited by examiner

CHANNEL, SYSTEM AND METHOD FOR MONITORING VOLTAGES

CROSS REFERENCE TO RELATED APPLICATION

This is the U.S. National Stage of International Application No. PCT/CA2010/001021, filed Jun. 30, 2010, which in turn claims the benefit of U.S. Provisional Application No. 61/221,870, filed Jun. 30, 2009. The provisional application is incorporated herein in its entirety.

TECHNICAL FIELD

The present disclosure relates to a channel, system and method for monitoring voltages.

BACKGROUND

A common manner of manufacturing a large voltage source capable of outputting a relatively large voltage is to connect in series a plurality of smaller voltage sources, each of which is capable of generating a relatively small voltage. The relatively small voltages generated by the plurality of smaller voltage sources connected in series cumulatively result in generation of the relatively large voltage. Such a technique is common and is used, for example, when generating a relatively large voltage using a stack of fuel cells or a series connection of battery cells for use in an electric vehicle.

Some challenges that arise when generating a relatively large voltage using a series connection of smaller voltage sources include those of inexpensively, accurately, quickly and simultaneously obtaining voltage measurements of any one of the smaller voltage sources. For example, when generating a relatively large voltage using a stack of fuel cells, monitoring the voltage generated by the individual fuel cells in the stack is important, for example, to ensure that the power being drawn from the stack does not force any individual cell into a detrimental or undesirable operating range. When generating a relatively large voltage using a series connection of battery cells in an electric vehicle, monitoring the voltage of individual battery cells is important, for example, to ensure that no cell is operating in an overcharged or undercharged state, as operation in such states can decrease overall battery performance and reduce battery life.

While systems and methods exist for measuring the voltage of individual or small groups of such smaller voltage sources, such systems and methods are lacking in several respects. Conventional systems and methods typically are limited to common mode voltage abilities of approximately 200 to 300 Volts, and their ability to be used in conjunction with a large voltage source capable of generating, for example, 1 kV or more is limited. Furthermore, conventional systems and methods are not very accurate, often having accuracies limited to about +/−5 mV.

Accordingly, there exists a need for a system and method for monitoring voltages that improves on at least one of the deficiencies of the prior art.

SUMMARY

According to a first aspect, there is provided a channel for monitoring a voltage signal. The channel includes a pair of terminals comprising a reference terminal and a measurement terminal, with the voltage signal measurable at the measurement terminal relative to the reference terminal. The channel also includes voltage signal processing circuitry electrically coupled to the pair of terminals to receive and process the voltage signal. The voltage signal processing circuitry has a memory having encoded thereon channel identification information comprising at least one of an operating mode of the channel and a serial number of the channel. The channel also includes an isolation block comprising an isolator having an input and an output that are electrically isolated from each other. The isolator input is electrically coupled to the voltage signal processing circuitry to receive the voltage signal and the channel identification information, and then to output the voltage signal and the channel identification information to the isolator output.

The voltage signal processing circuitry may include an analog-to-digital converter configured to digitize and then to output a digitized voltage signal and a microprocessor electrically coupled to the analog-to-digital converter and the memory to receive the digitized voltage signal and the channel identification information. The isolator input can be electrically coupled to the microprocessor to receive the digitized voltage signal and the channel identification information and then to output the digitized voltage signal and the channel identification information to the isolator output.

The microprocessor may be configured to linearly correct for one or both of gain factor and offset errors in the digitized voltage signal and then to output a corrected voltage signal to the isolator input; if the microprocessor is so configured, the isolator outputs the corrected voltage signal to the isolator output. The microprocessor may linearly correct for errors in the digitized voltage signal by setting the corrected voltage signal to (the digitized voltage signal)*(the gain factor)+(the offset).

The channel may be physically and electrically coupled to an electrical source that directly supplies the voltage signal to be measured, or that instead supplies a current signal to be measured. If the electrical source supplies a current signal, the current signal is passed through a current to voltage converter, such as a sense resistor, disposed within the channel. The voltage generated across the current to voltage converter is the voltage signal that the channel measures. The current to voltage converter may be directly coupled across the pair of terminals.

The channel may also include mode selection circuitry electrically coupled to the microprocessor and operable to indicate the operating mode. The operating mode may indicate whether the voltage signal results from the current signal flowing through the sense resistor. The operating mode may further indicate an expected voltage range of the voltage signal. The operating mode may further indicate whether the channel is configured to receive data transmitted using fully differential signalling. The mode selection circuitry may be a voltage divider configurable to output different voltages each indicative of the operating mode of the channel.

The channel may also include an isolated power supply electrically coupled to the voltage signal processing circuitry and the isolation block. The voltage signal processing circuitry and the isolation block may be powered with the isolated power supply.

The isolated power supply may include a secondary winding of a transformer configured to be inductively coupled to a primary winding of the transformer, with the secondary winding of the transformer being configured to output a pulse train when the primary winding is electrically coupled to a voltage source outputting the pulse train; a voltage rectifier electrically coupled to the secondary winding and configured to rectify the pulse train and to output a direct-current signal; and a voltage regulator electrically coupled to the voltage rectifier and to the voltage signal processing circuitry and configured to supply power to the voltage signal processing circuitry. The isolated power supply may also include a precision voltage reference electrically coupled to the voltage regulator, wherein the precision voltage reference outputs a first reference voltage used to bias the reference terminals.

To facilitate linear error correction, the microprocessor may be configured to switch between the digitized voltage signal, the first reference voltage, and a second reference voltage, wherein the first reference voltage and the second reference voltage are known values, and wherein the microprocessor is configured to calculate the gain factor and offset. The microprocessor can be configured to calculate the gain factor and offset by measuring the first reference voltage to obtain a measured first reference voltage, wherein the measured first reference voltage equals the gain factor multiplied by the first reference voltage plus the offset; measuring the second reference voltage to obtain a measured second reference voltage, wherein the measured second reference voltage equals the gain factor multiplied by the second reference voltage plus the offset; and solving for the gain factor and the offset using the measured reference voltages and the known values of the reference voltages.

According to another aspect, there is provided a system for monitoring a plurality of voltage signals. The system may include a plurality of channels, with any one or more of the channels being in accordance with any of the foregoing aspects, and a back end board for monitoring the plurality of voltage signals. The back end board may include a plurality of slots, each of the slots configured to be physically and electrically detachably coupled to one of the channels; and voltage sampling circuitry electrically coupled to the plurality of slots and configured to communicate with the plurality of channels such that the plurality of channels simultaneously sample the plurality of voltage signals.

The back end board may include the primary winding of the transformer such that when the channel is physically and electrically coupled into one of the slots, the secondary winding on the channel and the primary winding on the back end board are inductively coupled together.

To facilitate simultaneous sampling of a large number voltage signals (e.g.: 32) at once, the voltage sampling circuitry may include a field programmable gate array (FPGA). The voltage sampling circuitry may also include a microcontroller electrically coupled to the FPGA and configured to receive the voltage signals from the FPGA, to condition the voltage signals such that they are suitable for network transmission, and to output the voltage signals; and a network bus having an input and an output, the network bus input electrically coupled to the microcontroller and configured to receive the voltage signals from the microcontroller and to convey the voltage signals to the network bus output.

Each of the slots may include electrically conductive reference and measurement connectors each respectively configured to electrically mate with the reference and measurement terminals of one of the channels. The measurement connector of one of the slots may be electrically coupled to the reference connector of an adjacent slot that is adjacent to the one of the slots. The slots may be socketized to facilitate coupling and removal of the channels from the board.

The microcontroller may be configured to mitigate nonlinear errors in any one of the voltage signals by applying a quadratic correction formula to the voltage signal prior to outputting it to the network bus output.

The system may also include an off-board processor electrically coupled to the network bus output. The off-board processor may be electrically coupled to an off-board memory having stored thereon statements and instructions for causing the off-board processor to execute a method, comprising obtaining the channel identification information for at least one of the channels; and generating a current state manifest comprising a position of the at least one of the channels on the back end board and the channel identification information of the at least one of the channels. The method may also include associating, with the at least one of the channels, calibration data associated with the serial number of the at least one of the channels; and utilizing the calibration data to mitigate errors in the voltage signals received from the at least one of the channels. The calibration data may include a plurality of data points relating a listing of different digitized voltage signals to a listing of different first reference voltages; if so, the method can further include determining an interpolated reference voltage to be used when measuring the voltage signal by selecting two digitized voltage signals from the listing of different voltage signals that are closest to the digitized voltage signal determining the interpolated reference voltage from the different first reference voltages related to the two digitized voltage signals determining the voltage signal using the interpolated reference voltage instead of the first reference voltage.

The system may also include a display electrically coupled to the off-board processor. If so, the method executed by the off-board processor may also include determining whether the current state manifest differs from a stored, previous state manifest; when the current state manifest differs from the previous state manifest, displaying a prompt on the display to determine whether the current state manifest is acceptable; and when the current state manifest is acceptable, overwriting the stored, previous state manifest with the current state manifest. Alternatively or in addition, the method may include determining when the current state manifest comprises an invalid arrangement of channels; and when the current state manifest comprises the invalid arrangement of channels, displaying a warning on the display.

The invalid arrangement of channels may include one of the channels being electrically coupled to one of the slots and configured to receive data transmitted using fully differential signalling, and another one of the channels being electrically coupled to another slot that is adjacent to the one of the slots. Alternatively or in addition, the invalid arrangement of channels may include one of the channels being electrically coupled to one of the slots and configured to measure voltage signals falling within a first voltage range, and another one of the channels being electrically coupled to another slot that is adjacent to the one of the slots and configured to measure voltage signals falling with a second voltage range that differs from the first voltage range.

A plurality of temperature sensors may be disposed on the back end board and electrically coupled to the microcontroller. The microcontroller may linearly interpolates a temperature reading of a location on the back end board between the plurality of temperature sensors to perform cold junction compensation when the operating mode of the at least one of the plurality of channels is that of a thermocouple.

According to a further aspect, there is provided a method for monitoring a voltage signal. The method includes sampling the voltage signal using a channel; isolating and then outputting the voltage signal and the channel identification information from the channel; and processing the voltage signal in accordance with channel identification information stored on the channel, the channel identification information comprising at least one of an operating mode of the channel and a serial number of the channel.

The method may also include digitizing the voltage signal to create a digitized voltage signal; and linearly correcting for one or both of gain factor and offset errors in the digitized voltage signal and then outputting a corrected voltage signal. Digitizing the voltage signal and linearly correcting the digitized voltage signal may be performed on the channel. Linearly correcting for one or both of gain factor and offset errors may include setting the corrected voltage signal to (the digitized voltage signal)*(the gain factor)+(the offset).

The channel may receive a current signal; if so, the current signal may be passed through a current to voltage converter, such as a sense resistor, with the voltage signal being measured across the current to voltage converter. In this sense, the current to voltage converter can act as a voltage source that supplies the voltage signal.

The operating mode of the channel may also be selected. The operating mode can indicate whether the voltage signal results from the current signal flowing through the sense resistor. The operating mode may further indicate an expected voltage range of the voltage signal. The operating mode may also indicate whether the channel is configured to receive data transmitted using fully differential signalling. The operating mode can be selected by selecting different voltages each indicative of the operating mode of the channel.

The voltage signal can be biased by a reference voltage output by an isolated power supply.

The voltage signals may be simultaneously sampled by virtue of receiving a simultaneous clock signal from a field programmable gate array (FPGA). The voltage signals can be conditioned such that they are suitable for network transmission, and they can then be output to a network bus.

Non-linear errors in the voltage signal can be mitigated by applying a quadratic correction formula to the voltage signals.

Calibration data can be associated with the serial number of each of the channels. The calibration data can be used to mitigate errors in the digitized voltage signal. The calibration data can be composed of a plurality of data points relating a listing of different digitized voltage signals to a listing of different first reference voltages. An interpolated voltage reference to be used when measuring the voltage signal can be determined by selecting two digitized voltage signals from the listing of different voltage signals that are closest to the digitized voltage signal; determining the interpolated reference voltage from the different first reference voltages related to the two digitized voltage signals. The voltage signal can then be determined using the interpolated reference voltage instead of the first reference voltage.

A current state manifest composed of a position of the channel and the channel identification information can be generated.

It can also be determined whether the current state manifest differs from a stored, previous state manifest; if so, a prompt can be displayed to determine whether the current state manifest is acceptable. When the current state manifest is acceptable, the stored, previous state manifest can be overwritten with the current state manifest.

It can also be determined when the current state manifest comprises an invalid arrangement of channels. When the current state manifest comprises the invalid arrangement of channels, a warning can be displayed. The invalid arrangement of channels may include one of the channels being electrically coupled to one of the slots and configured to receive data transmitted using fully differential signalling, and another one of the channels being electrically coupled to another slot that is adjacent to the one of the slots. Alternatively or in addition, the invalid arrangement of channels may include one of the channels being electrically coupled to one of the slots and configured to measure voltage signals falling within a first voltage range, and another one of the channels being electrically coupled to another slot that is adjacent to the one of the slots and configured to measure voltage signals falling with a second voltage range that differs from the first voltage range.

According to another aspect, there is provided a channel for monitoring a voltage signal. The channel includes a pair of terminals in the form of a reference terminal and a measurement terminal. The voltage signal is measurable at the measurement terminal relative to the reference terminal. The channel also includes voltage signal processing circuitry electrically coupled to the pair of terminals to receive and process the voltage signal. The voltage signal processing circuitry includes an analog-to-digital converter configured to digitize and then to output a digitized voltage signal; and a microprocessor electrically coupled to the analog-to-digital converter to receive the digitized voltage signal and configured to linearly correct for one or both of gain factor and offset errors in the digitized voltage signal and then to output a corrected voltage signal. The channel also includes an isolation block, which is composed of an isolator having an input and an output that are electrically isolated from each other. The isolator input is electrically coupled to the microprocessor to receive the corrected voltage signal and then to output the corrected voltage signal to the isolator output.

Beneficially, when both of the isolated power supply and the isolator act to electrically isolate the channel, the channel is better able to monitor voltage even if a very high common mode voltage is present. Additionally, the linear correction that can be employed by the microprocessor on the channel and the quadratic correction that can be employed by the microcontroller on the back end board can both help to measure voltages to a high degree of accuracy.

Also beneficially, the use of channel identification information to identify the channels helps to facilitate modularity in design. The channel identification information allows the channels to be configured in different operating modes (e.g.: +/−5V, +/−3V, 0-20 mA, thermocouple), with the data that the channel outputs for each mode configured to be processed using different types of algorithms. By having the channel store its operating mode, different channels can be swapped on the back end board with the off-board processor or microcontroller being automatically informed, by accessing the channel identification information, concerning how to process the data coming from the channel. Furthermore, by associating calibration data with a serial number that is particular to one of the channels, measurement accuracy can be further increased by performing error correction that is customized for the particular one of the channels.

DETAILED DESCRIPTION

The embodiments described herein are able to accurately monitor a relatively small voltage generated by any one or more of a plurality of smaller voltage sources, where the smaller voltage sources are electrically coupled in series to collectively form a larger voltage source that generates a relatively large voltage. An example of a "relatively large voltage" is 1 kV; an example of a "relatively small voltage" is 5V. Although the embodiments described herein discuss voltage sources electrically coupled in series, persons skilled in the art will understand that such embodiments can also be applied to measure voltage sources electrically coupled in parallel. The relatively large voltage is the sum of the relatively small voltages. The ability to measure a relatively small voltage generated by any one or more of the plurality of smaller voltage sources is useful when dealing with a stack of fuel cells or with battery cells for use in an electric vehicle, for example, because in both such applications the relatively small voltages generated by the plurality of smaller voltage sources can indicate whether the fuel or battery cells are operating properly.

The following embodiments utilize a plurality of channels to measure voltage signals from a voltage source, where individual channels measure a voltage signal from one or more relatively small voltage sources that are part of a larger voltage source. In this document, the terms "voltage" and "voltage signal" are used interchangeably, as are "monitor" and "measure". The small voltage source is typically a voltage-generating cell, such as a fuel cell or a battery cell, but can also be a plurality of such cells connected in series. Each of the channels includes an analog front end, a microprocessor, an isolator, and an isolated power supply. One way in which the following embodiments enable accurate voltage measurements is by accounting for linear errors in the voltage signal by utilizing a method within the microprocessor that mitigates such errors by calculating a gain factor and an offset from two known reference voltages. While various specific embodiments of circuitry for creating and switching between the two known reference voltages are described herein, any suitable circuitry as is known to a skilled person can be used so long as the microprocessor is able to access both the known reference voltages. The presence of the isolator and of the isolated power supply also help enable the following embodiments to have very good common mode voltage capability. The channels can be electrically and physically coupled to a back end board that has either on it or in electrical communication with it voltage sampling circuitry such as a field programmable gate array (FPGA) and a microcontroller. The microcontroller can transfer voltage measurements across a bus to an off-board processor for further processing, such as a suitably configured personal computer.

Figure 1:
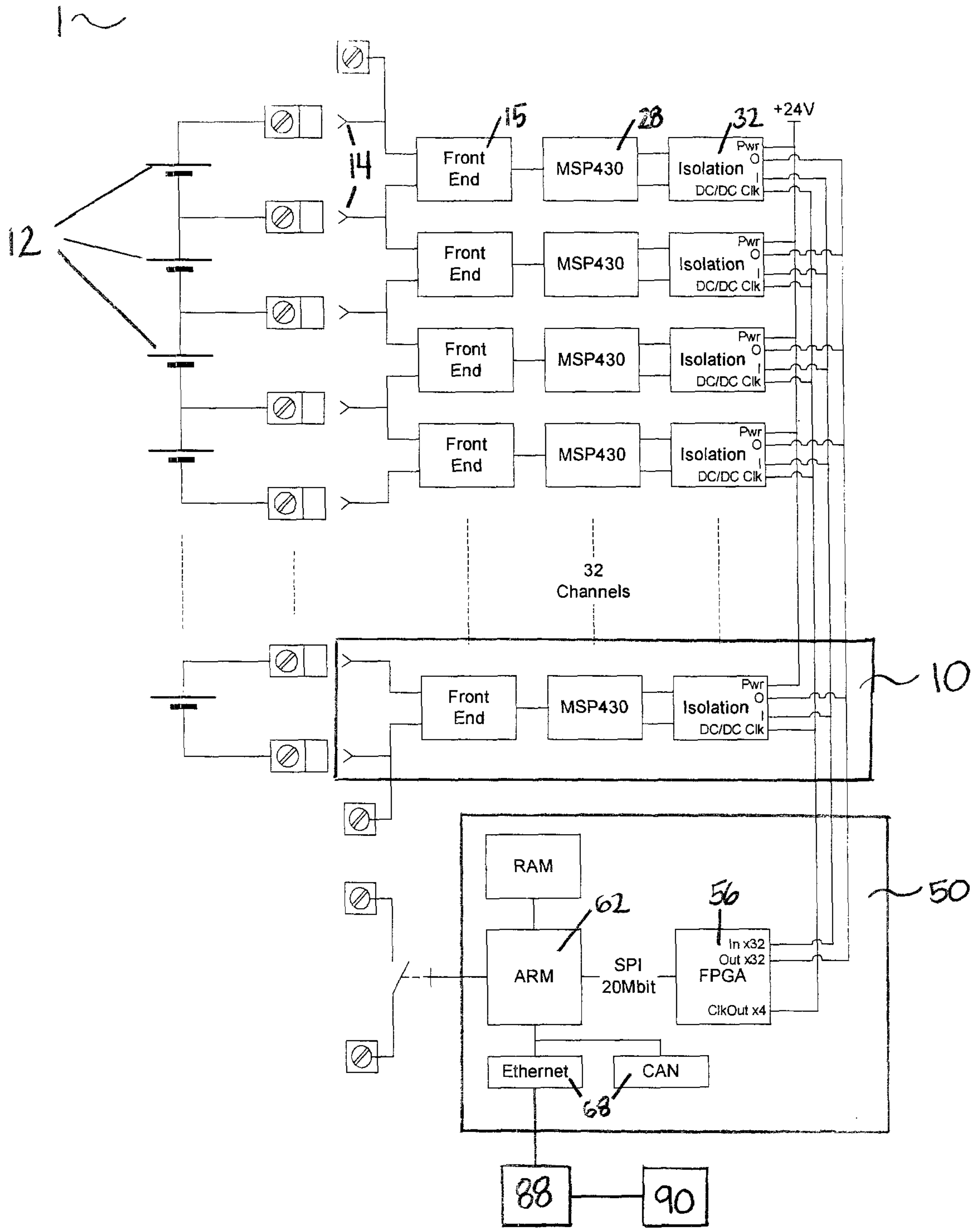
FIG. 1 is a block diagram of a system for monitoring voltages according to a first embodiment, the system including a plurality of channels electrically coupled to a back end board.

Referring now to FIG. 1, there is depicted a system 1 for acquiring and for processing a voltage signal from a voltage source 12, such as a fuel cell in a fuel cell stack or a battery cell in a battery used in an electric vehicle. In FIG. 1, a plurality of the voltage sources 12 are shown electrically coupled in series.

Figure 2:
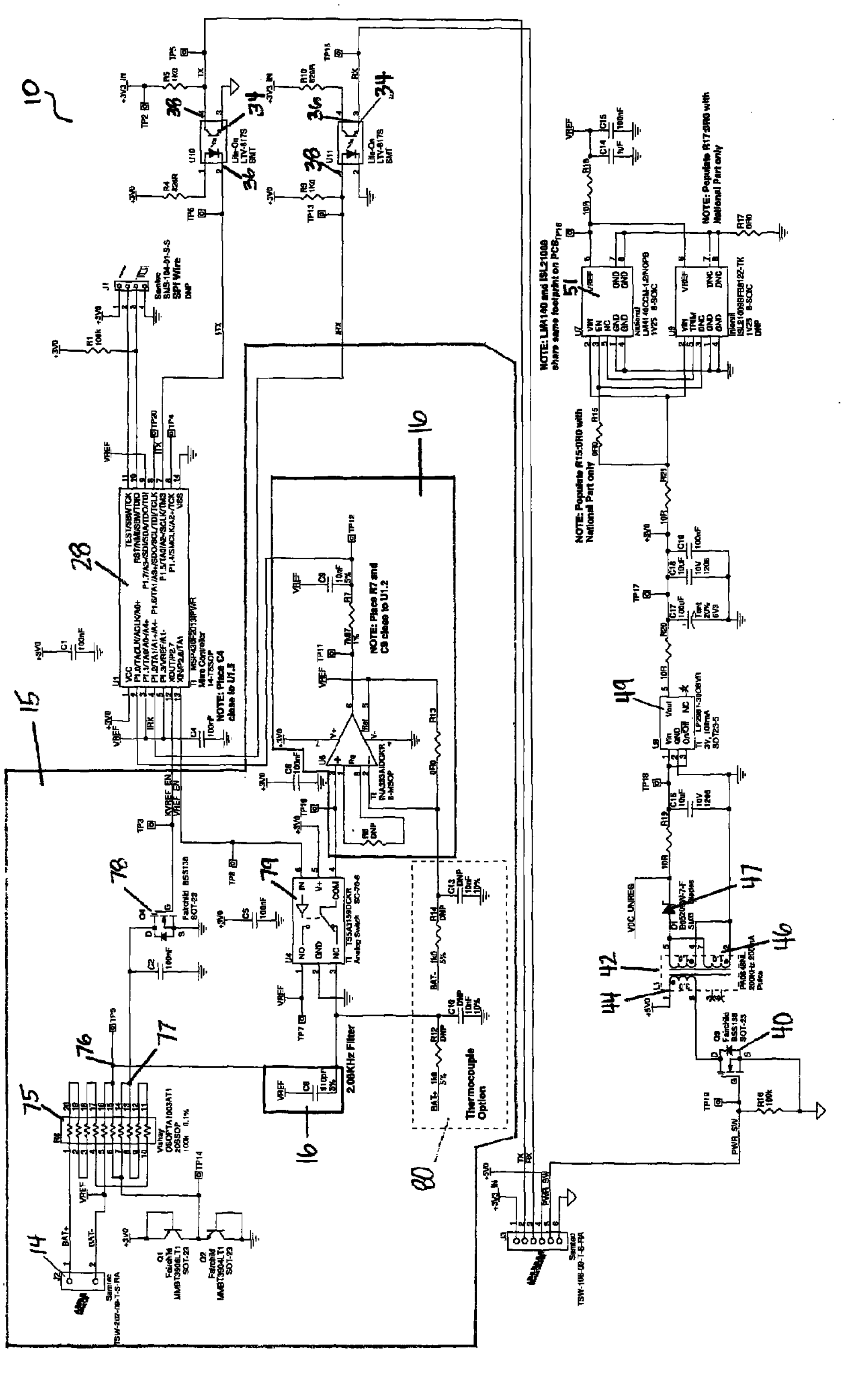
FIG. 2 is a schematic view of one of the channels according to the embodiment of FIG. 1.

The system 1 includes a plurality of channels 10, with each channel having an analog front end 15 that receives the voltage signal from a pair of terminals 14, which are in electrical communication with the voltage source 12. A number of steps are then performed to condition, convert, modify or otherwise process the voltage signal. The analog front end 15 conditions, through filtering, and outputs the voltage signal to a microprocessor assembly 28, which can digitize and perform linear error correction on the voltage signal. The microprocessor assembly 28 then outputs the voltage signal to an isolator in the form of an opto-isolator 34 (depicted in FIG. 2, below), through which electrical communication is made to a back end board 50. Isolation block 32 includes the opto-isolator 34 used to transmit signals from the microprocessor assembly 28 to the back end board 50. The isolation block 32 also includes a second opto-isolator 34 that is electrically coupled to the microprocessor assembly 28 and is used to send signals to the microprocessor assembly 28 from the back end board 50, and an isolated power supply used to supply power to the channel 10. Both this second opto-isolator 34 and the isolated power supply are depicted in FIG. 2, discussed below. The back end board 50 has on it an FPGA 56, which is particularly useful for simultaneously accepting a large number of voltage signals from a plurality of channels 10, and for instructing the plurality of channels 10 to simultaneously sample the large number of voltage signals. The FPGA 56 is one form of voltage sampling circuitry; alternatively, a circuit that generates a high fan-out clock signal could be coupled to the plurality of channels 10 in order to instruct the plurality of channels 10 to simultaneously sample the large number of voltage signals, for example. A suitable FPGA includes one or more banks of Altera Cyclone III FPGAs. A microcontroller 62 that is on the back end board 50 receives the voltage signal from the FPGA 56, and conditions the voltage signal for transmission along a network bus 68, such as an Ethernet or CAN bus, off the back end board 50 for further processing by an off-board processor 88 in the form of, for example, a suitably configured personal computer. The off-board processor 88 can interact with a user via a display 90 connected to the off-board processor 88. A suitable microcontroller 62 is an ARM Cortex-M3 microcontroller. Individual isolation of each channel 10 and optional linear error correction performed by the microprocessor 28 and quadratic error correction performed by the microcontroller 62 all aid in providing a highly accurate voltage measurement. "Highly accurate" in this context means an accuracy of within +/−2 mV when the voltage signal can be between −5V and 5V.

Referring now to FIG. 2, depicted is the circuitry that is used on each of the channels 10. The circuitry includes the analog front end 15, which is electrically coupled to the microprocessor assembly 28, which in turn is electrically coupled to a pair of opto-isolators 34. The microprocessor assembly 28 includes an integrated analog-to-digital converter (not shown) and microprocessor (not shown). The microprocessor assembly 28 is connected to one of the opto-isolators 34 via a transmission line, labelled "ITX" in FIG. 2, and is connected to the other of the opto-isolators 34 via a receiving line, labelled "IRX" in FIG. 2. The transmission and receiving lines allow serial communication between the microprocessor assembly 28 and the FPGA 56 (not shown in FIG. 2), to which the opto-isolators 34 are electrically coupled.

As noted above, the voltage signal received by the channel 10 is conditioned, converted, modified or otherwise processed in a number of different steps carried out by the channel 10. Hereinafter in this disclosure, prior to digitization by the analog-to-digital converter, the voltage signal is referred to simply as "the voltage signal"; following digitization by the analog-to-digital converter and prior to linear correction being performed by the microprocessor, the voltage signal is referred to as "the digitized voltage signal"; and following linear correction by the microprocessor, the voltage signal is referred to as "the corrected voltage signal".

When a voltage is to be measured from a voltage source such as a fuel cell, the voltage signal enters the analog front end 15 through the pair of terminals 14. In the depicted embodiment, the pair of terminals 14 do not physically contact the voltage source. Instead, the voltage source is in physical contact with the back end board 50 (not shown in FIG. 2), and traces on the back end board 50 convey the voltage signal to the pair of terminals 14. As indicated in FIG. 2, the pair of terminals 14 is composed of a reference terminal, labelled BAT− on FIG. 2, and a measurement terminal, labelled BAT+ on FIG. 2. During the voltage measurement process, the reference terminal BAT− is set to float at a known first reference voltage, labelled $V_{REF}$ on FIG. 2, and the voltage signal from the positive battery terminal BAT+ is measured relative to the known first reference voltage $V_{REF}$. Both the voltage signal from the measurement terminal BAT+ and the known first reference voltage $V_{REF}$ (from the negative battery terminal BAT−) are then electrically coupled to opposite terminals of a two-terminal resistor array 75 that is composed of ten identical resistors in series. Seven resistors are electrically coupled in series between the measurement terminal BAT+ and a first tap point 77. The first tap point 77 is electrically coupled to the microprocessor assembly 28 via a transistor 78 that acts as a microprocessor assembly-controlled switch. The KVREF_EN signal that can be transmitted from the microprocessor assembly 28 to the gate of the transistor 78 controls whether the transistor 78 acts as an open or closed switch. Nine resistors are electrically coupled in series between the measurement terminal BAT+ and a second tap point 76, from which the voltage signal leaves the resistor array 75 and is conducted to the remainder of the analog front end 15.

As the channel 10 uses an isolated power supply, the known first reference voltage $V_{REF}$ for any one of the channels 10 does not affect the voltage signal as measured by any other of the channels 10, nor does it affect generation of the other known first reference voltages $V_{REF}$ generated by any other of the channels 10. Advantageously, setting the reference terminal BAT− to float at the known first reference voltage $V_{REF}$ biases the voltage signal at the measurement terminal BAT+ by the known first reference voltage $V_{REF}$, as measured within the channel 10 at the microprocessor assembly 28. The analog-to-digital converter within the microprocessor assembly 28, which also accepts the known first reference voltage $V_{REF}$ as an input, can thereby easily determine whether the voltage signal at the measurement terminal BAT+ is positive (measured to be greater than the known first reference voltage $V_{REF}$) or negative (measured to be less than the known first reference voltage $V_{REF}$).

When KVREF_EN is low and the transistor 78 is off, the voltage signal at the second tap point 76 is equal to $9/10$ of the voltage signal at the measurement terminal BAT+. The voltage signal at the second tap point 76 is then conducted to a switch 79, which is electrically coupled to the microprocessor assembly 28 and is controlled by the VREF_EN signal that can be transmitted from the microprocessor assembly 28 to the switch 79. When VREF_EN is low, the switch 79 electrically couples the second tap point 76 to a filtering stage 16. The filtering stage 16 depicted in FIG. 2 is 2-pole RC low-pass filter having a cut-off frequency of approximately 1.5 kHz. The voltage signal at the output of the filtering stage 16 is then conducted to one of the inputs of the microprocessor assembly 28 where it is digitized by the analog-to-digital converter (not shown) for further processing by the microprocessor (not shown).

Over time, errors can begin to affect the accuracy of the voltage measurements. These errors occur because characteristic properties of semiconductor devices slowly change over time and as a result of usage. These changes can affect gain, offset, and linearity. The microprocessor within the microprocessor assembly 28 can linearly correct for such errors by accounting for gain factor and offset errors in the measured voltage signal. In other words, ideally, whenever the microprocessor measures the voltage signal, the measured voltage signal is exactly equal to the actual voltage signal that is present between the measurement and reference terminals BAT+ and BAT−. However, practically, the digitized voltage signal will differ from the actual voltage signal between the battery terminals BAT+ and BAT−. The relationship between the actual voltage signal and the digitized voltage signal can be linearly modelled using the formula (the actual voltage signal)=(the gain factor)*(the digitized voltage signal)+(the offset), where the digitized voltage signal is the voltage signal that is digitized by the analog-to-digital converter and that is input to the microprocessor and the gain factor and offset are calculated as described below.

In order to determine what the gain factor and the offset are, the following method programmed as instructions and stored on a memory in the microprocessor assembly 28 can be executed by the microprocessor assembly 28. The microprocessor assembly 28 can measure the known first reference voltage $V_{REF}$ and can measure a known second reference voltage, and can thereby generate a system of two equations having two unknowns as follows:

(the known first reference voltage)=(the gain factor)*(a measured first reference voltage)+(the offset) (1)

(the known second reference voltage)=(the gain factor)*(a measured second reference voltage)+(the offset) (2)

Equations (1) and (2) can then be solved for the gain factor and the offset, which are the only unknowns. The microprocessor assembly 28 is programmed to recalculate the gain factor and the offset using Equations (1) and (2) periodically; for example, every five seconds.

The microprocessor assembly 28 is further programmed to access the known first and second reference voltages, as follows. The microprocessor assembly 28 first accesses the known first reference voltage $V_{REF}$ by setting the VREF_EN signal to the high state. The switch 79 then switches its input from the second tap point 76 to the known first reference voltage $V_{REF}$, thereby conducting the known first reference voltage $V_{REF}$ to the filtering stage 16. The microprocessor assembly 28 accesses the known second reference voltage by setting the VREF_EN signal to the low state and by turning the transistor 78 on by setting the KVREF_EN signal to the high state. When the transistor 78 is on, the first tap point 77 is grounded. The voltage signal at the second tap point 76 consequently becomes equal to ⅔ of the known first reference voltage $V_{REF}$, or ⅔·$V_{REF}$. Consequently, with VREF_EN being low, the known second reference voltage ⅔·$V_{REF}$ will be conducted through the switch 79 and the filtering stage 16, and to the microprocessor assembly 28.

Therefore, by setting the VREF_EN signal to the high state and then acquiring the known first reference voltage $V_{REF}$, and by setting the VREF_EN signal to the low state and the KVREF_EN signal to the high state and then acquiring the known second reference voltage ⅔·$V_{REF}$, Equations (1) and (2) can be solved by the microprocessor assembly 28 for the gain factor and the offset, which is then applied to linearly reduce the error of subsequent measurements of the voltage at the measurement terminal BAT+.

Voltage signal processing circuitry refers generally to the circuitry electrically coupled between the pair of terminals 14 and the opto-isolators 34 through which the voltage signal is conducted and is processed. In FIG. 2, the voltage signal processing circuitry includes the resistor array 75, the switch 79, the filtering stage 16 and the microprocessor assembly 28. In alternative embodiments, however, the voltage signal processing circuitry does not necessarily include all of the components depicted in FIG. 2. For example, instead of using the filtering stage 16, which utilizes analog circuitry, filtering could be done digitally within the microprocessor assembly 28. As another example, the voltage signal could be directly electrically coupled to the microprocessor assembly 28 without the use of the resistor array 75 and the switch 79. Similarly, in an alternative embodiment, the voltage signal processing circuitry may include more components than depicted in FIG. 2 (e.g.: additional switches or filtering).

In order to generate the known first reference voltage $V_{REF}$, power circuitry as depicted on FIG. 2 can be utilized. The power circuitry is a DC-to-DC converter and includes a switch in the form of a transistor 40 and a transformer 42 having a primary winding 44 and a secondary winding 46. The primary winding 44 is electrically coupled on one lead to a +5V DC source, and on the other lead to the drain of the transistor 40. The back end board 50 is powered by a +24V DC source, which is stepped down using a DC-DC step down regulator to generate the +5V DC source used to power the channel 10. The source of the transistor 40 is electrically coupled to ground, and the gate of the transistor 40 is controlled by the PWR_SW signal, which is electrically coupled to and set high or low by the FPGA 56. The FPGA 56 pulses the gate of the transistor 40 at an operating frequency, thereby resulting in voltage pulses at the operating frequency being conducted through the primary winding 44 of the transformer 42, which induces a voltage in the secondary winding 46. A typical operating frequency is 200 KHz. The voltage induced in the secondary winding 46 is an alternating-current signal. This alternating-current signal is rectified by a voltage rectifier, a diode 47, to create a direct-current signal in the form of an unregulated DC voltage, as indicated by the label VDC_UNREG on FIG. 2. The unregulated DC voltage is subsequently filtered and passed through a voltage regulator, linear regulator 49, and a voltage reference integrated circuit 51, which outputs the known first reference voltage $V_{REF}$. The circuitry in place between the secondary winding 46 and the output of the voltage reference integrated circuit 51 is one form of voltage reference circuitry electrically coupled to the secondary winding 46 of the transformer 42 that is configured to generate the known first reference voltage $V_{REF}$. This circuitry, in conjunction with the resistor array 75 and the transistor 78, is one form of voltage reference circuitry electrically coupled to the secondary winding 46 of the transformer 42 that is configured to generate the known second reference voltage, ⅔·$V_{REF}$.

The output of the linear regulator 49 is a 3V signal that is passively filtered and then supplied to the microprocessor assembly 28 and filtering stage 16. The transistor 40, the transformer 42, the diode 47, the linear regulator 49, and the passive filtering circuitry electrically coupled thereto together make up the isolated power supply that supplies power to the voltage signal processing circuitry.

The power circuitry depicted in FIG. 2 can be divided between the channel 10 and the back end board 50 as desired. For example, all of the power circuitry depicted in FIG. 2 may be present on the channel 10. Alternatively, the transistor 40 and the primary winding 44 of the transformer 42 may be located on the back end board 50, with the remainder of the power circuitry located on the channel 10. The transformer 42 galvanically isolates the transistor 40 and the primary winding 44 of the transformer 42 from the remainder of the power circuitry, thus providing the isolation for the isolated power supply.

Once the microprocessor assembly 28 has linearly corrected for errors in the digitized voltage signal, it serially outputs the corrected voltage signal along the transmission line ITX to an input 36 of one of the opto-isolators 34, which outputs the corrected voltage signal through its output 38 and to the FPGA 56. Similarly, the microprocessor assembly 28 can receive instructions from the FPGA 56 along the transmission line IRX via the other of the opto-isolators 34.

The inputs 36 of the opto-isolators 34 are electrically isolated from the outputs 38 of the opto-isolator 34. Similarly, the secondary winding 46 of the transformer 42 is isolated from the primary winding 44. Consequently, each of the channels 10 is electrically isolated from the back end board 50. Such isolation is beneficial in that it can increase the common mode voltage capability of the channel 10 such that it can accurately take measurements of individual cells wherein the cumulative voltage generated by all the cells is approximately 1 kV. Instead of the common mode voltage capability of the channel 10 being limited by the common mode voltage capability of electronic components on the back end board 50, it is limited primarily by printed circuit board (PCB) layout considerations of the channel 10 and the isolation ratings of the opto-isolators 34 and the transformer 42.

Typical components used on the channel 10 include a Samtec TSW-202-09-T-S-RA header for the pair of terminals 14; a Vishay OSOPTA1003AT1 resistor array for the resistor array 75, populated with ten, high precision 0.1% 100 kΩ resistors; Fairchild BSS138 transistors for the transistors 40, 78; a Texas Instruments TS5A3159DCKR analog switch for the switch 79; a Texas Instruments MSP430 microprocessor having an integrated 16-bit analog-to-digital converter for the microprocessor assembly 28; Lite-on LTV-817S opto-isolators for opto-isolators 34; a MuRata 78253-55MVC transformer as the transformer 42; a Texas Instruments LP2981-30 DBVR as the linear regulator 49; and a National Semiconductor LM4140CCM-1.2/NOPB as the voltage reference integrated circuit 51. The use of high precision components (such as 0.1% resistors in the resistor array 75), a 16-bit analog-to-digital converter, and the linear gain factor and offset correction all assist in providing highly accurate measurements. Instead of a Samtec TSW-202-09-T-S-RA header, an edge connector type device similar to that used to couple RAM chips to motherboards can be used.

Figure 3:
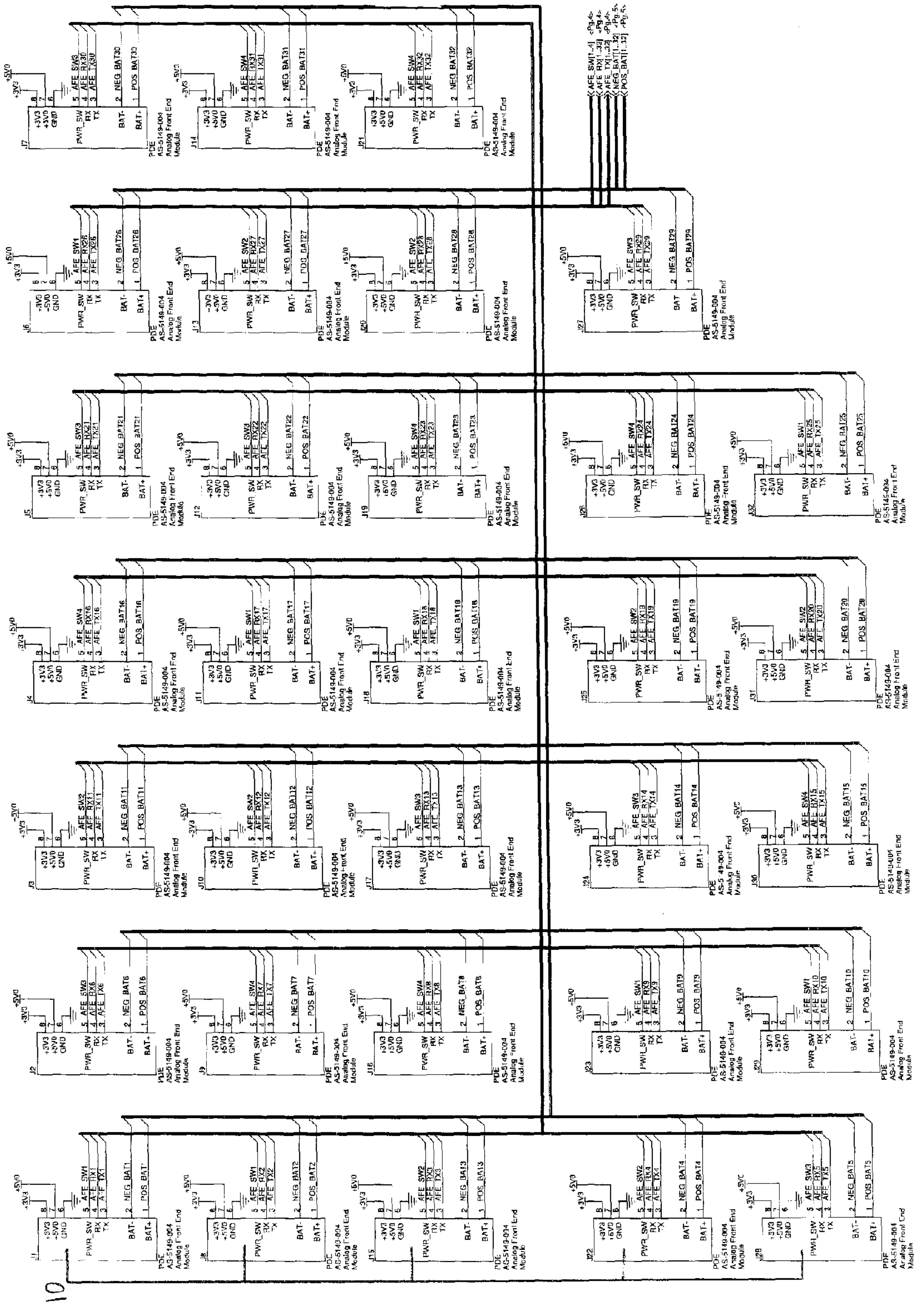
FIG. 3 is a schematic view depicting 32 of the channels electrically coupled to the back end board, according to the embodiment of FIG. 1.

FIG. 3 is a schematic view of 32 of the channels 10 ready for coupling to the back end board 50. The transmission lines used to transmit signals to and from each of the channels 10 and the FPGA 56 are grouped together as buses AFE_SW[1 . . . 4], AFE_RX[1 . . . 32], and AFE_TX[1 . . . 32]. Buses NEG_BAT[1 . . . 32] and POS_BAT[1 . . . 32] are used to transmit the voltage signals from the voltage sources being measured to the channels 10. Adjacent pairs of transmission lines in the NEG_BAT[1 . . . 32] and POS_BAT[1 . . . 32] buses are electrically coupled to each other; for example, POS_BAT[2] and NEG_BAT[3] are electrically coupled, as are POS_BAT[3] and NEG_BAT[4], etc.; this is hereinafter referred to as a "daisy chained" configuration. Each of the transmission lines in the AFE_SW[1 . . . 4] bus is a clock output from the FPGA 56 that controls the PWR_SW signal on one of the channels 10. Four different transmission lines in the AFE_SW[1 . . . 4] bus, each of which conducts a signal that is out of phase with that conducted by another of the four transmission lines, are used to help prevent current spikes. Each of the transmission lines in the AFE_RX[1 . . . 32] and AFE_TX[1 . . . 32] buses is coupled to the IRX and ITX transmission lines, respectively, on one of the channels 10, via one of the opto-isolators 34. Each of the NEG_BAT[1 . . . 32] and POS_BAT[1 . . . 32] transmission lines is coupled to one of the reference terminals BAT− and measurement terminals BAT+, respectively, on one of the channels 10. Notably, while 32 of the channels 10 are illustrated in FIG. 3, any number of channels 10 can also be used so long as the back end board 50 is suitably modified.

Figure 4:
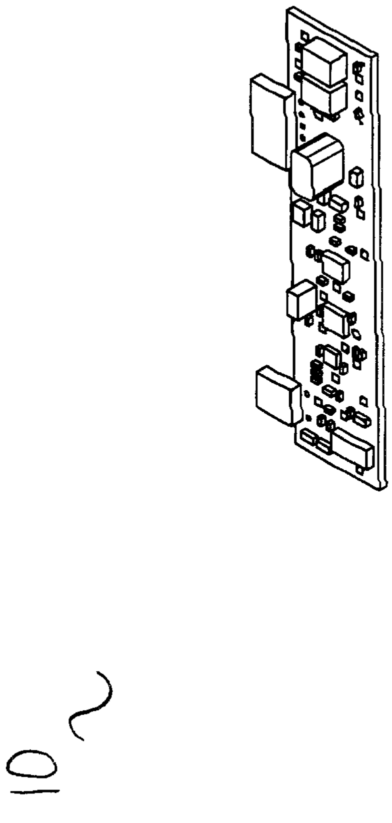
FIG. 4 is a perspective view of one of the channels according to the embodiment of FIG. 1, manufactured utilizing a printed circuit board (PCB)
Figure 5:
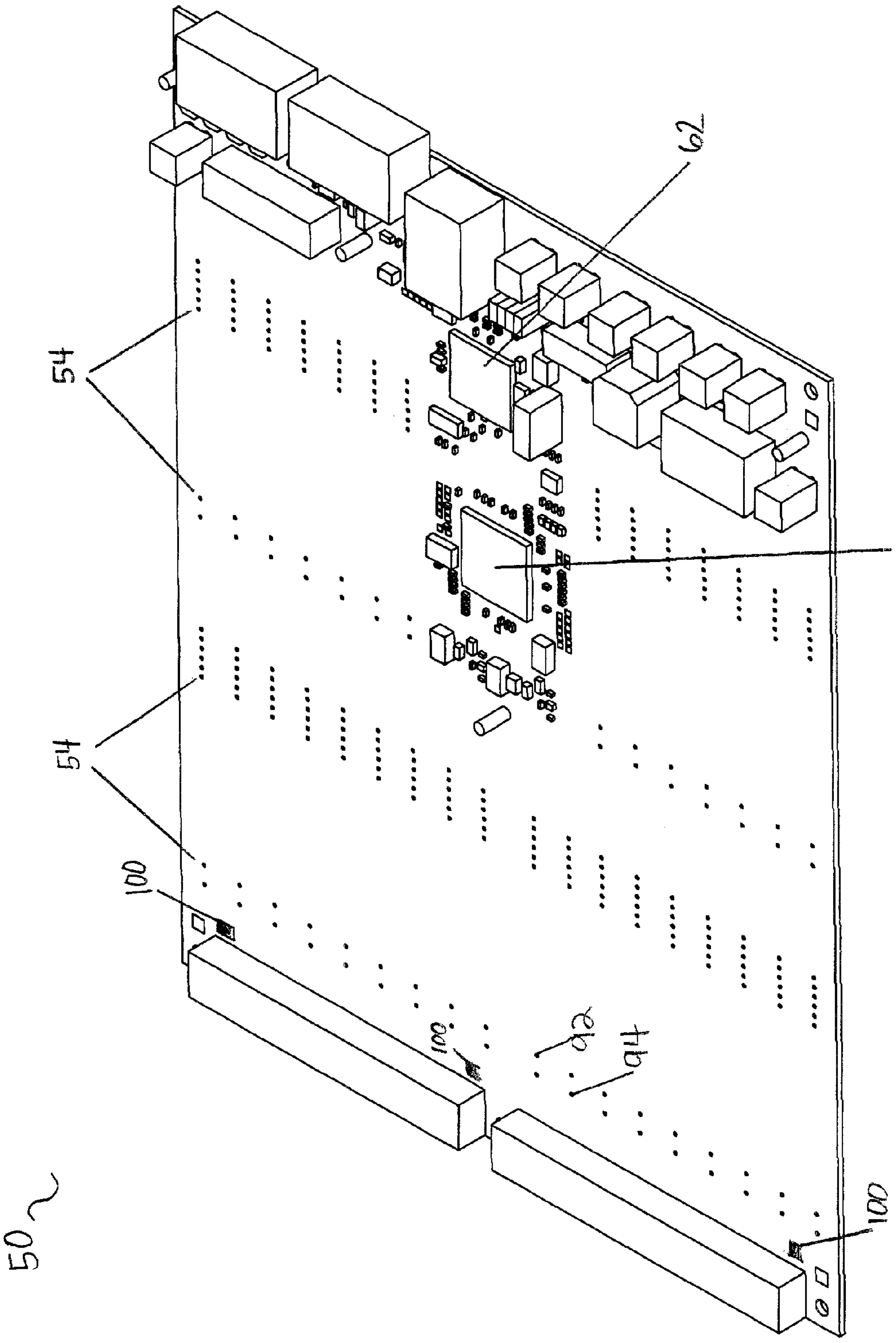
FIG. 5 is a perspective view of the back end board according to the embodiment of FIG. 1, manufactured utilizing a PCB.
Figure 6:
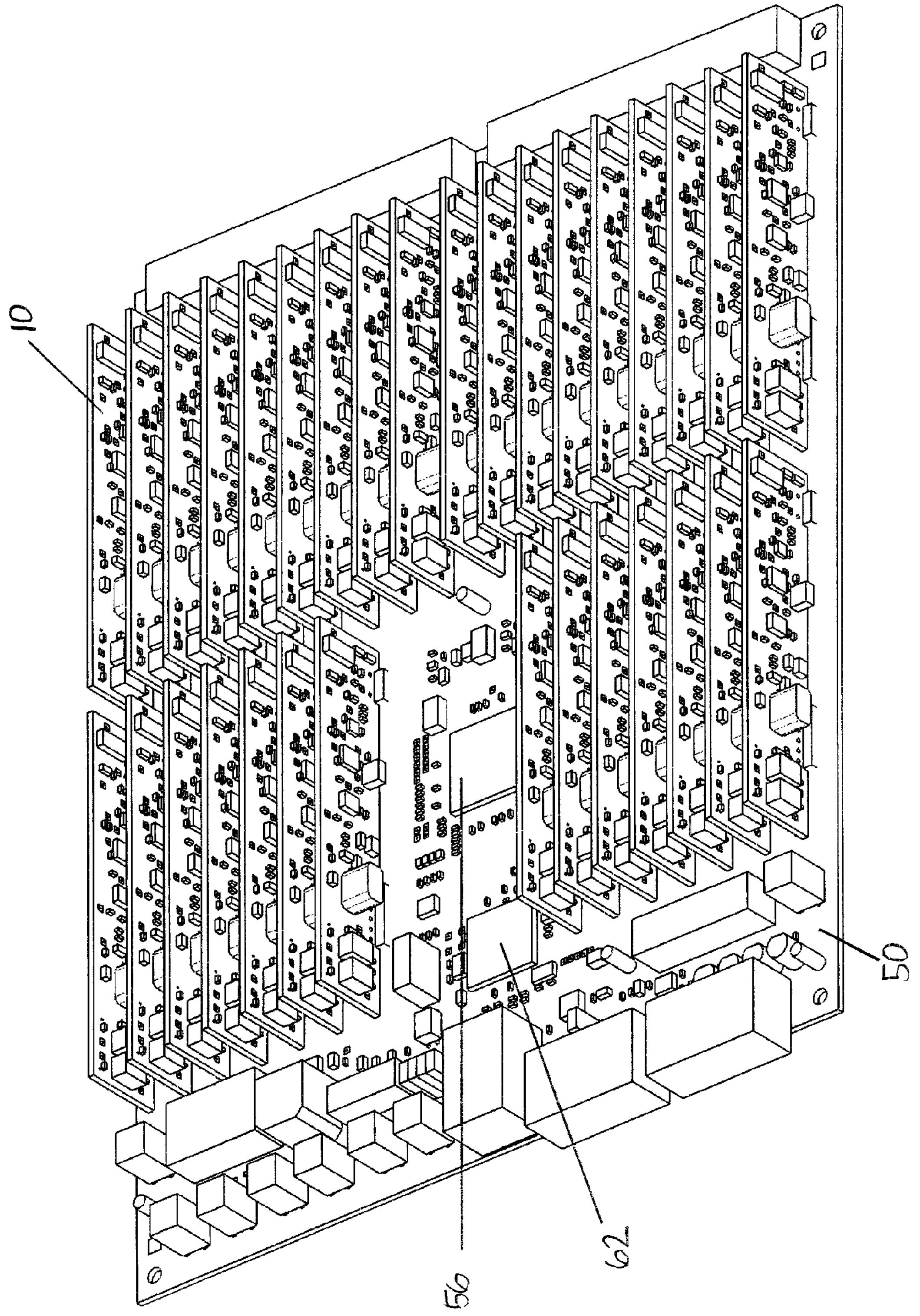
FIG. 6 is a perspective view of 32 of the channels in PCB form, as depicted in FIG. 4, electrically and physically coupled to the back end board in PCB form, as depicted in FIG. 5.

Referring now to FIGS. 4 to 6, there are depicted perspective views of one of the channels 10, the back end board 50, and 32 of the channels 10 electrically and physically coupled to the back end board 50, respectively, all in PCB form. Each of the channels 10 is electrically and physically coupled to the back end board 50 via slots 54 in the back end board 50. Each of the slots 54 has a reference connector 92 and a measurement connector 94. For any given one of the slots 54, the reference terminal BAT− and the NEG_BAT transmission line are electrically coupled to the reference connector 92; similarly, the measurement terminal BAT+ and the POS_BAT transmission line are electrically coupled to the measurement connector 94. As mentioned above, adjacent NEG_BAT and POS_BAT transmission lines are also electrically daisy chained together. As depicted in FIG. 6, the slots 54 position the channels 10 such that each of the channels 10 is oriented and projects at approximately 90 degrees from the back end board 50. This results in efficient use of space, and allows a large number of channels 10 to be accommodated on the back end board 50, even when the back end board 50 is of relatively small size.

As mentioned above, the FPGA 56 is particularly useful in this context for being able to transmit and receive large amounts of data in parallel; i.e., buses AFE_SW[1 . . . 4], AFE_RX[1 . . . 32], and AFE_TX[1 . . . 32]. Communication between the FPGA 56 and the microcontroller 62 is serial and can occur, for example, according to the Serial Peripheral Interface (SPI) Bus protocol. The microcontroller 62 is electrically coupled to an input of a network bus 68, such as an Ethernet or CAN bus. The network bus 68 has an output that is coupled to the off-board processor 88 that further processes the voltage measurement data transmitted on AFE_RX[1 . . . 32] and AFE_TX[1 . . . 32]. The off-board processor 88 can be simultaneously in communication with several back end boards 50.

A data acquisition rate (DAQ) of up to approximately 100 Hz is easily sustainable according to the embodiments of the system and method as described above. Higher DAQs are also possible. For example, when 64 of the channels 10 are being used, a DAQ of 1 kHz is sustainable. The microcontroller 62 is further programmed to carry out a "burst" mode, which temporarily allows one or both of potentially higher DAQs with the same number of channels 10 or a high 1 kHz DAQ when more than 64 of the channels 10 are used. The "burst" mode can be initiated by sending a binary signal from the off-board system to the microcontroller 62. When the off-board system is in communication with several of the back end boards 50, the off-board system can initiate "burst" mode in any one or more of the back end boards 50. During "burst" mode, a message may be sent to the microprocessor assembly 28 via the ITX transmission line instructing the microprocessor assembly 28 not to linearly correct any errors in the voltage signal, since at very high sampling rates the microprocessor assembly 28 may not have enough time to execute linear error correction.

Similar to how the microprocessor on each of the channels 10 is able to increase measurement accuracy by linearly correcting for errors in the voltage signals, the microcontroller 62 is configured to increase measurement accuracy by non-linearly (in this case, quadratically) correcting for errors in the voltage signals. As discussed above, when linearly correcting for errors using the microprocessor, (the actual voltage signal)=(the gain factor)*(the digitized voltage signal)+(the offset). When quadratically correcting for errors using the microcontroller 62, (the actual voltage signal)=a*(the corrected voltage signal)$^2$+b*(the corrected voltage signal)+c, where the "corrected voltage signal" is the voltage signal that the microprocessor assembly 28 has linearly corrected. Typical values for a, b, and c are 0.00000001, −0.998809419172346, and 25.76234234, respectively, although the values for the coefficients will typically depend on the particular channel 10 and, consequently, calibration is performed to determine appropriate values. The coefficients a, b, and c can be calibrated by electrically coupling the back end board 50 with the channels 10 coupled thereto to an external calibration system (not shown). The external calibration system provides, at a minimum, three precision voltage inputs to each of the channels 10 and reads the voltage signals measured by the channels 10. The external calibration system then applies a second order polynomial fitting process to the voltage signals through which the coefficients a, b and c are determined and then downloaded to the non-volatile memory of the microcontroller 62.

One of the benefits of the aforedescribed embodiments is that the voltage signals acquired using the back end board 50 are not limited to a single type of input. The back end board 50 depicted in FIGS. 5 and 6, for example, has thirty-two slots 54 for thirty-two channels 10; however, the back end board 50 does not need to be populated such that all the slots 54 are solely filled with the channels 10 configured to measure and then digitally transmit voltage signals. Should fully differential signalling be desired, every other of the slots 54 can be populated with one of the channels 10, to result in sixteen fully differential voltage signal measurements; by populating every other one of the slots 54, the channels 10 are not electrically daisy chained together. As discussed in more detail with respect to FIG. 9, below, in an alternative embodiment each of the channels 10 can be configured to function as a thermocouple that utilizes fully differential signalling. When the channel 10 is so configured, every other of the slots 54 can be populated with the channel 10 such that sixteen separate temperature readings can be acquired. Alternatively, using another alternative type of channel 10 (not depicted), the back end board 50 can be used to output analog voltage and current measurements, or because the channels 10 are already configured for digital communication with the microprocessor assembly 28, the channels 10 can easily be redesigned into a further alternative embodiment (not depicted) that allows for general purpose digital communication. Various combinations of the above configurations are also possible: for example, eight of the channels 10 with the thermocouple block 80 populated can be used to acquire eight fully differential voltage signals that correspond to temperature readings; eight of the channels 10 can be used to acquire single-ended voltage signals as described in respect of FIG. 2, above; four of the channels 10 according to an alternative embodiment (not depicted) can be used to acquire four fully analog signals; and four of the channels 10 according to an alternative embodiment (not depicted) can be used for general purpose digital communications. Not all of the slots 54 in the back end board 50 need to be populated using the channels 10 when the back end board 50 is in use.

Individually isolating communication to each of the channels 10 through use of the opto-isolators 34 located on each of the channels 10 and locating the power circuitry for each of the channels 10 on the channel 10 itself aids in the ability to configure the back end board 50 such that it can be used to convey various types of signals. For example, by locating the opto-isolators 34, which communicate digitally, on the channels 10 themselves, the back end board 50 can still be used to transmit analog signals when a channel 10 configured for analog communication is physically and electrically coupled thereto. Similarly, as circuitry that is used to convey different types of signals can have different power requirements, locating the power circuitry on the channels 10 themselves allows each of the channels 10 to be customized such that its power requirements are met. In any case, customization can be performed at the level of the channel 10, and the same back end board 50 can be simultaneously used with a plurality of different types of channels 10.

Customization is also aided by the fact that when the microcontroller 62 communicates data to the off-board processor 88, the data is sent in the form of 16-bit unsigned integers that do not incorporate therein information as to the nature of the information that is being sent. For example, regardless of whether the information being sent relates to measurements of voltages generated by individual electrochemical cells or temperature readings acquired by a thermocouple, the microcontroller 62 is configured to send an unsigned 16-bit integer to the off-board processor 88. A user of the off-board processor 88 who has knowledge of how the back end board 50 is configured can program the off-board processor 88 to interpret and otherwise process the unsigned 16-bit integers according to the nature of data they represent. This allows the amount of data that has to be transferred from the microcontroller 62 to the off-board processor 88 to be kept relatively low, since the transferred data does not need to include information on the nature of the data being sent. It also allows customization to be located in the off-board processor 88 as opposed to on the back end board 50, thereby allowing the back end board 50 to remain flexible and easily configurable through use with differently configured types of channels 10 to acquire a variety of different types of signals. The back end board 50 can be utilized with a variety channel 10 types to monitor, for example, individual electrolyser cells in electrolyser stacks and can also be used in the area of general purpose module in/out. For example, when a 16-bit unsigned integer, which ranges from 0 to 65,536, is used to express measurements, the off-board processor 88 may interpret a reading of "30,000" as either a reading of −1.00 V or a temperature difference of 10° C., depending on whether the off-board processor 88 receives the measurement from a channel used to measure voltages or a channel configured to act as a thermocouple.

Additional Embodiments of the Channel 10

Figure 7:
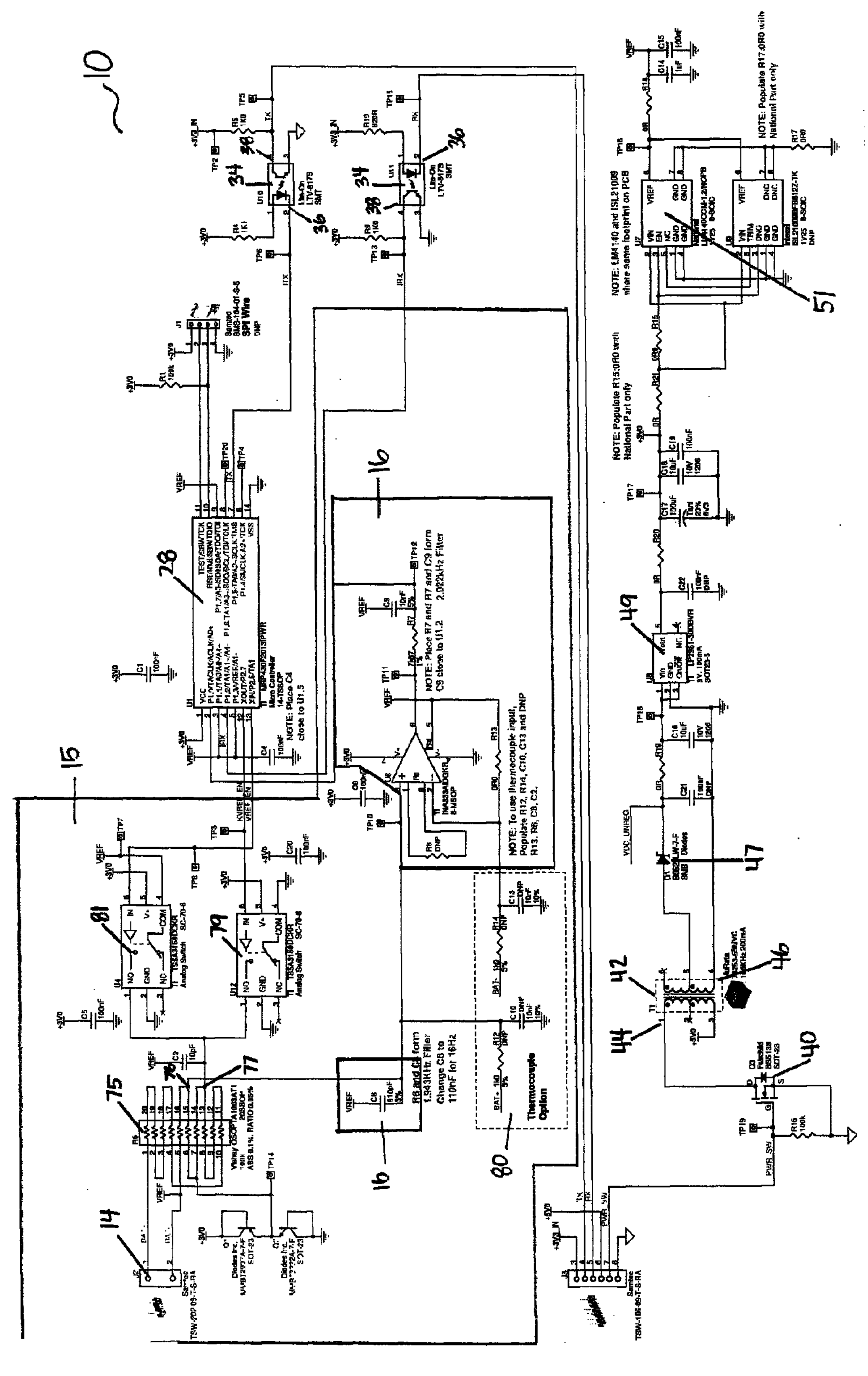
FIGS. 7 to 9 are schematic views of one of the channels that can be used in the system of FIG. 1, according to alternative embodiments.

Referring now to FIG. 7, there is depicted an alternative embodiment of the channel 10. The embodiment of the channel 10 in FIG. 7 is similar to the embodiment of the channel 10 in FIG. 2, with a difference being the switching circuitry that is coupled to the microprocessor assembly 28 that enables the microprocessor assembly 28 to switch between the known first reference voltage $V_{REF}$ and the known second reference voltage $\frac{2}{3}\cdot V_{REF}$. In FIG. 7, the output (terminal 4) of the switch 79 is no longer electrically coupled to the filtering stage 16, but is instead shorted to ground. The transistor 78 used in the embodiment of the channel 10 in FIG. 2 is replaced with a second analog switch 81 in the alternative embodiment of FIG. 7, the output (terminal 4) of which is shorted to $V_{REF}$. Consequently, when the microprocessor assembly 28 desires to select the known first reference voltage $V_{REF}$, it can set KVREF_EN to low and VREF_EN to high, thereby shorting the second tap point 76, which is coupled to the input of the filtering stage 16, to the known first reference voltage $V_{REF}$. Alternatively, when the microprocessor assembly 28 desires to select the known second reference voltage $\frac{2}{3}\cdot V_{REF}$, it can set KVREF_EN to high and VREF_EN to low, thereby shorting the first tap point 77 to ground, which sets the second tap point 76 to the known second reference voltage $\frac{2}{3}\cdot V_{REF}$.

According to a further alternative embodiment of the channel 10 (not depicted), a three-way switch can be used to supply the filtering stage 16 with the known first reference voltage $V_{REF}$, the known second reference voltage $\frac{2}{3}\cdot V_{REF}$, and the voltage signal from the BAT+ terminal. The known second reference voltage $\frac{2}{3}\cdot V_{REF}$ could be created, for example, using a voltage divider having the known first reference voltage $V_{REF}$ as an input. According to a further alternative embodiment of the channel 10 (not depicted), no switching circuitry external to the microprocessor assembly 28 is required at all, and the known first reference voltage $V_{REF}$, the known second reference voltage $\frac{2}{3}\cdot V_{REF}$, and the voltage signal from the BAT+ terminal can be electrically coupled to three different microprocessor assembly 28 inputs. Any suitable circuitry or method of enabling the microprocessor assembly 28 to access the voltage signal from the BAT+ terminal and the known first and second reference voltages as is known to a skilled person can be used, so long as the microprocessor assembly is able to access all such inputs so as to be able to calculate the gain factor and the offset from Equations (1) and (2), and subsequently linearly correct for errors in the voltage signal.

Figure 8:
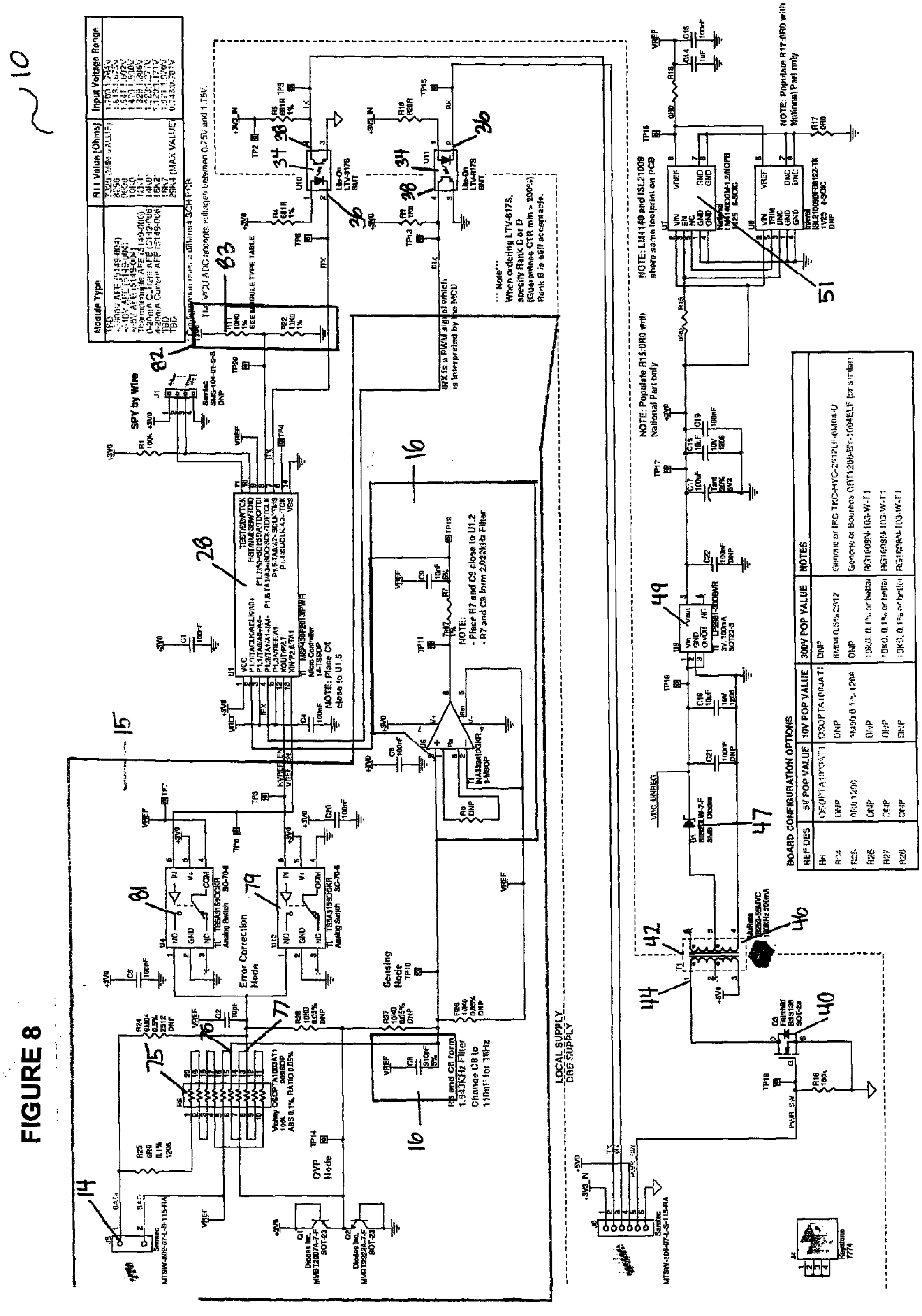
Figure 9:
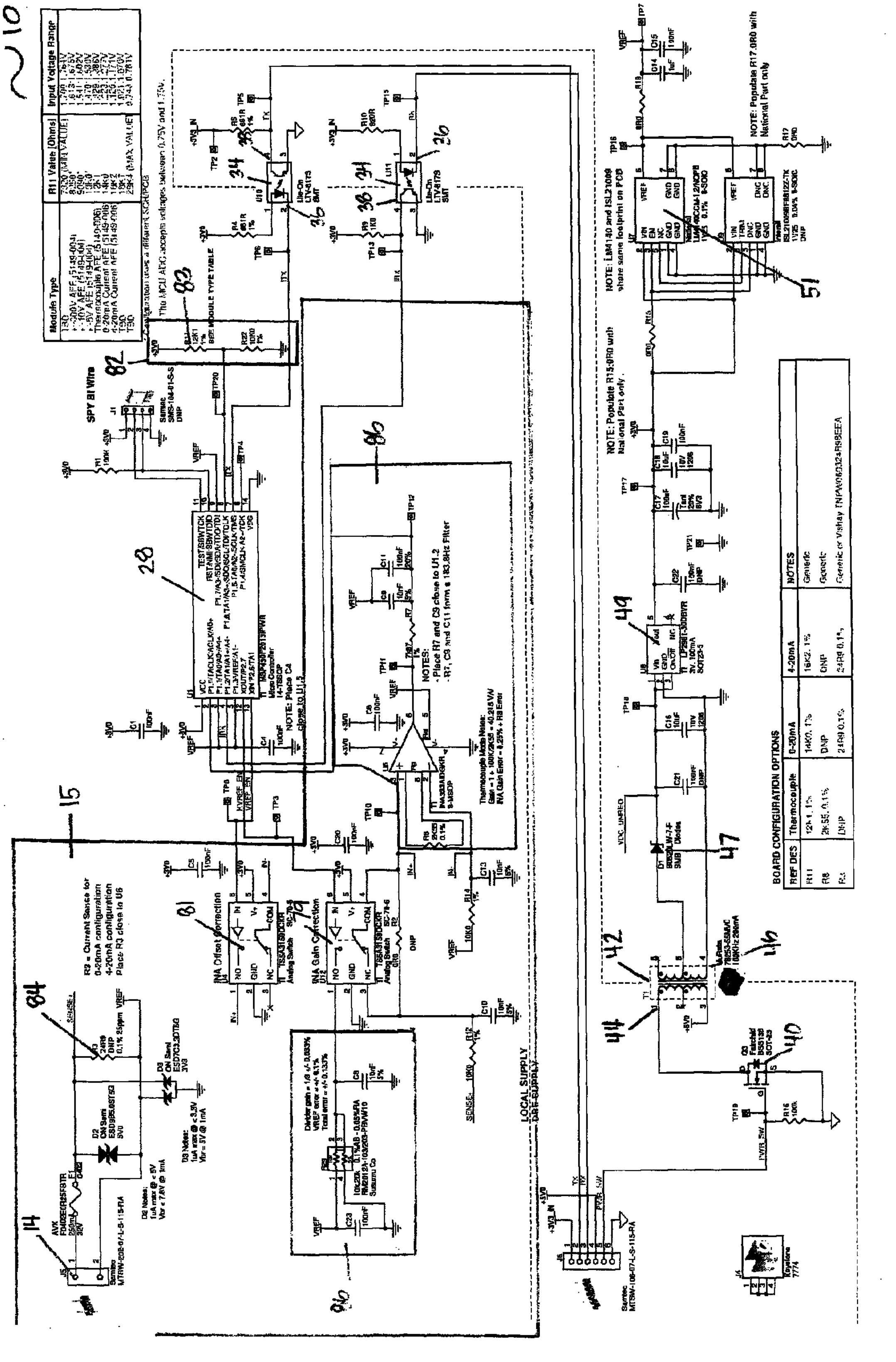

Referring now to FIGS. 8 and 9, there are depicted further alternative embodiments of the channel 10. The embodiment of the channel 10 depicted in FIG. 8 is configured to receive the voltage signal from the voltage source 12, to digitize it, to perform linear correction on the digitized voltage signal and then output the corrected voltage signal to the opto-isolator 34. In contrast, the embodiment of the channel in FIG. 9 is configured to receive a current signal and to convert the current signal into the voltage signal; the voltage signal is then processed and output to the opto-isolator 34. Consequently, the channel 10 of FIG. 8 is particularly configured to receive only voltage signals, while the channel 10 of FIG. 9 is particularly configured to receive only current signals. A "voltage signal" is an electrical signal in which information is communicated via the voltage of the electrical signal; in contrast, a "current signal" is an electrical signal in which information is communicated via the current of the electrical signal.

The channel 10 depicted in FIG. 8 is similar to the channel 10 depicted in FIG. 7 with one difference being that the channel 10 of FIG. 8 is not designed to be able to act as a thermocouple or to receive current signals, so the thermocouple block 80 is not present; and with another difference being that the microprocessor assembly 28 can be particularly configured to receive different ranges of voltage signals. Each of the different ranges corresponds to a different operating mode of the channel 10. The operating mode of the channel 10 is selected using mode selection circuitry in the form of a voltage divider 82 that is electrically coupled to the microprocessor assembly 28. In the depicted embodiment, the voltage divider 82 is composed of a voltage selection resistor 83 coupled in series with a 10 kΩ resistor, both of which are coupled in series between a 3 V source and ground. Depending on the value of the selection resistor 83, different input voltages are input to the microprocessor assembly 28, which indicates to the microprocessor assembly 28 that it should be prepared to receive voltage signals in the ranges as follows in Table 1. Depending on the operating mode, the resistive network through which the voltage signal propagates prior to entering the analog-to-digital converter can also be adjusted so as to maximize or otherwise make efficient use of the voltage range of the analog-to-digital converter; e.g., if the operating mode indicates that the voltage will be relative low, resistive attenuation prior to the analog-to-digital converter can be decreased.

TABLE 1

Exemplary Relationships Between Channel Operating Mode, Selection Resistor Value, and Microprocessor Assembly Input Voltage (Input to Channel is Voltage Signal)

| Channel Operating Mode | Magnitude of Selection Resistor (Ω) | Voltage Divider Output to Microprocessor Assembly (V) |
|---|---|---|
| +/−300 V | 8,250 | 1.613-1.675 |
| +/−10 V | 9,080 | 1.541-1.602 |
| +/−5 V | 10,000 | 1.470-1.530 |

The channel 10 depicted in FIG. 9 is similar to the channel 10 depicted in FIG. 8, with one difference being that the channel 10 of FIG. 9 is configured to be used to receive either a current signal or a voltage signal from a thermocouple (not shown). When used to receive a current signal, the current signal enters the channel 10 through the pair of terminals 14 and passes through a current to voltage converter in the form of a sense resistor 84, thereby generating the voltage signal; in this manner, when the channel 10 is used to receive the current signal, the sense resistor 84 acts as a voltage source in that the voltage that is measured by the channel is the voltage that is across the sense resistor 84. When used to receive a signal from a thermocouple, the sense resistor 84 is bypassed. As in the foregoing embodiments, the voltage signal is biased by $V_{REF}$. The voltage signal then passes through an amplification and filtering stage 86, in which the voltage signal is amplified by about 40.215 and filtered through a 2 pole, low pass filter. As with the channel 10 of FIG. 8, selecting different values for the selection resistor 83 allow the microprocessor assembly 28 to be prepared to receive current signals in the ranges as follows in Table 2:

TABLE 2

Exemplary Relationships Between Channel Operating Mode, Selection Resistor Value, and Microprocessor Assembly Input Voltage (Input to Channel is Current Signal or Signal from Thermocouple)

| Channel Operating Mode | Magnitude of Selection Resistor (Ω) | Voltage Divider Output to Microprocessor Assembly (V) |
|---|---|---|
| Thermocouple | 12,100 | 1.328-1.386 |
| 0-20 mA | 14,000 | 1.223-1.277 |
| 4-20 mA | 18,700 | 1.021-1.070 |

Although Tables 1 and 2 depict exemplary values for the selection resistor 83 and exemplary voltage outputs of the voltage divider 82, in alternative embodiments different values for the selection resistor 83 and different input voltages can be used.

Figure 11:
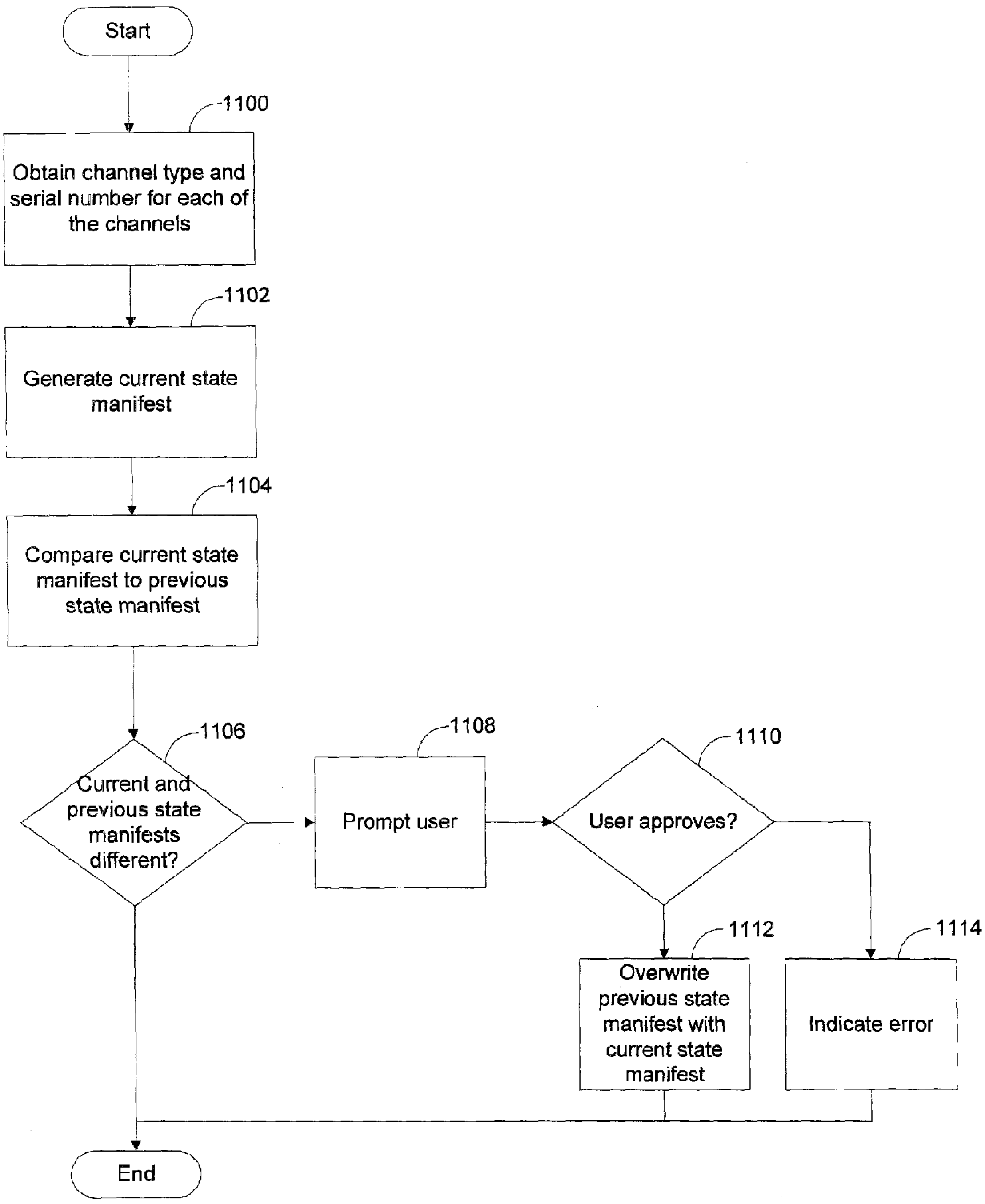
FIG. 11 is a flowchart depicting an exemplary method for generating and storing a current state manifest summarizing attributes of the channels coupled to the back end board.

The microprocessor assembly 28 stores information on the channel operating mode of the channel 10 and also stores a serial number that is unique to the channel 10, regardless of its operating mode. Collectively, the serial number and the channel operating mode are "channel identification information"; in alternative embodiments, the channel identification information may include other pieces of data such as duration of operation. Referring now to FIG. 11, there is depicted an exemplary method by which the off-board processor 88 can maintain a record of the operating modes and serial numbers of the various channels 10.

At block 1100, the microcontroller 62 communicates with the microprocessor assembly 28 on each of the channels 10. The microcontroller 62 retrieves the channel identification information from the microprocessor assembly 28 of each of the channels 10. The microcontroller 62 stores the channel identification information along with information on which of the slots 54 each of the channels is inserted. In the foregoing embodiment of the back end board 50 in which there are 32 of the slots 54, the position of each of the slots 54 on the back end board 50 can be uniquely identified by a number from 0 to 31, and a look-up table in the memory of the microcontroller 62 can be created in which are associated the position of a particular slot 54 and the channel identification information of the channel 10 inserted into that particular slot 54; this look-up table is hereinafter referred to as a "current state manifest" of the system 1. The microcontroller 62 generates the current state manifest of the system 1 at block 1102.

Each time the system 1 is powered up, the microcontroller 62 generates a new current state manifest for the system 1. At block 1104, the off-board processor 88 accesses the current state manifest of the system 1 and compares it against a stored, previous state manifest for the system 1 (block 1106). If the state of the system 1 is unchanged (i.e.: if none of the channels 10 have been moved on the back end board 50), then the stored, previous state manifest for the system remains accurate is therefore not overwritten. If the state of the system 1 has changed (e.g.: if one of the channels 10 has been swapped for another of the channels 10), then the current state manifest will differ from the stored, previous state manifest. In order to ensure that this change is intended, the off-board processor 88 will display a prompt to a user of the system 1 on the display 90 asking the user to confirm that the change is desired (block 1108). If the user approves (block 1110), then the off-board processor 88 instructs the microcontroller 62 to overwrite the stored, previous state manifest with the current state manifest (block 1112). If the user disapproves (block 1110), then the off-board processor 88 indicates to the user via the display 90 that there is an error in the system 1, and does not overwrite the stored, previous state manifest (block 1114). In response to the error, the user may physically examine the back end board 50 and the channels 10 to ensure that the system 1 is operational. The off-board processor 88 may also instruct the microcontroller 62 to deactivate any of the channels 10 that are responsible for the discrepancy between the current and previous state manifests to ensure that all data collected using the system 1 is reliable (not shown).

Disposed near an edge of the back end board 50 are multiple temperature sensors 100 that are electrically coupled to the microcontroller 62. When the channels 10 operate as a thermocouple, the cold junctions for the channels 10 are in the same vicinity as the temperature sensors 100. To increase accuracy of temperature readings, the microcontroller 62 can linearly interpolate a temperature reading of a location on the back end board that is between any two of the temperature sensors 100.

The off-board processor 88 stores calibration data in association with each of the channels 10. The calibration data is particular to each of the channels 10; an excerpt of a calibration file containing the calibration data follows:

| | |
|---|---|
| #Channel 1 | |
| Channel Serial No. | 123456789 |
| Operating Mode | 5 Volt |
| VrefCalibrationTable | |
| Calibration Date | Aug. 24, 2009 |
| Type of interpolation | Linear |
| ADCoffset | 0 |

| ADCval | Vref (volts) |
|---|---|
| 38036 | 1.249033 |
| 43289 | 1.249354 |
| 48569 | 1.249466 |
| 53821 | 1.24963 |
| 56463 | 1.249598 |
| 56968 | 1.249669 |
| 57502 | 1.249644 |
| 58034 | 1.249658 |
| 58569 | 1.249635 |
| 59073 | 1.249665 |

The calibration data contains the following fields:

#Channel1: This identifies to which of the channels 10 the calibration data is applicable. For example, if calibration data for thirty-two different channels is stored, the calibration file will contain headers from #Channel1 to #Channel32.

Channel Serial No.: This identifies the particular serial number unique to each of the channels 10.

Operating Mode: This identifies the operating mode of the channel 10. The channel 10 associated with this exemplary calibration data is configured to receive +/−5 V signals.

VrefCalibrationTable: This identifies that the following rows of calibration data relate to calibrating $V_{REF}$.

Calibration Date: This identifies the last date on which the channel 10 was calibrated.

Type of Interpolation: This identifies what type of interpolation is to be applied to the points listed under the ADCval header, as discussed in more detail below. In the present embodiment, linear interpolation between points is used; in an alternative embodiment, quadratic interpolation may be used, for example.

ADCoffset: This identifies how much of an offset is introduced to the voltage signal by the analog-to-digital converter. The reading is expressed in the units used by the analog-to-digital converter to express the digitized voltage signal. In the present embodiment in which the analog-to-digital converter expresses the digitized voltage signal as a 16-bit unsigned integer, the digitized voltage signal may be any value from 0 to 65,536, and the ADCoffset is expressed as a 16-bit unsigned integer between 0 and 65,536. The ADCoffset is measured by shorting the pair of terminals 14 together and measuring the resulting digitized voltage signal; the value of the digitized voltage signal when the pair of terminals 14 are shorted together is the ADCoffset.

ADCval: In the present embodiment, the value of $V_{REF}$ that is output by the voltage reference integrated circuit 51 is 1.250000 V. The off-board processor 88 uses $V_{REF}$ in a formula that is determined using circuit analysis techniques that are known to skilled persons to compute the value of the voltage signal. However, it has been empirically determined that voltage signals computed using a value of $V_{REF}$ equal to the theoretical value output by the voltage reference integrated circuit 51 results in computed values of the voltage signal that significantly differ slightly from the value of the voltage signal as measured by a high precision voltmeter. The listing of different $V_{REF}$ values associated with the listing of different digitized voltage signal values under ADCval are those values for $V_{REF}$ that the off-board processor 88 uses in conjunction with the digitized voltage signal readings to compute values of the voltage signal that match the values of the voltage signal measured using the high precision voltmeter. For example, in the above example, in order to compute a value of the voltage signal that matches the empirically measured value, the off-board processor 88 uses a value for $V_{REF}$ of 1.249033 V when the digitized voltage signal from the ADC is 38036 instead of the theoretical value for $V_{REF}$ of 1.250000 V.

When the digitized voltage signal does not exactly match any of the different digitized voltage signals listed under ADCval in the calibration data, the off-board processor 88 uses linear interpolation to determine what value for $V_{REF}$ to use to compute the voltage signal ("interpolated reference voltage"). For example, if the digitized voltage signal is 40663 (halfway between 38036 and 43289), the off-board processor will calculate the interpolated reference voltage to be 1.249194 V (halfway between 1.249033 and 1.249354). Interpolating for a value for $V_{REF}$ in this manner has empirically been found to result in +/−1 mV accuracy of most of a +/−5 V voltage signal range.

Calibration data is particular to an individual one of the channels 10; consequently, even if two of the channels 10 are operating in identical channel modes, the calibration data for each of the two channels 10 will likely be different. Consequently, the off-board processor 88 associates the calibration data with the serial number of the channel 10.

Optionally, the off-board processor 88 can analyze the current state manifest of the system 1 to determine whether the channels 10 have been arranged in an invalid arrangement on the back end board 50. For example, some of the channels 10 on the back end board 50 may be configured to operate as thermocouples using fully differential signalling, while some of the channels 10 on the back end board 50 may be configured to operate as cell voltage monitors. To operate properly, the channels 10 that are configured to communicate using fully differential signalling communicate via one of the slots 54 that is sandwiched between two empty slots 54; i.e., the slot reference connector 92 and the slot measurement connector 94 of the slot 54 into which the channel 10 is inserted are electrically coupled only to the channel 10 that is communicating using fully differential signalling, and not to any other of the channels 10. As another example, when multiple of the channels 10 are daisy chained together, the off-board processor 88 can check to ensure that all of the daisy chained channels 10 are configured in the same operating mode (e.g.: to operate in the +/−5 Volt range). That is, a first voltage range in which one of the channels 10 operate should not differ from a second voltage range in which an adjacent, daisy chained one of the channels 10 operates.

Figure 10:
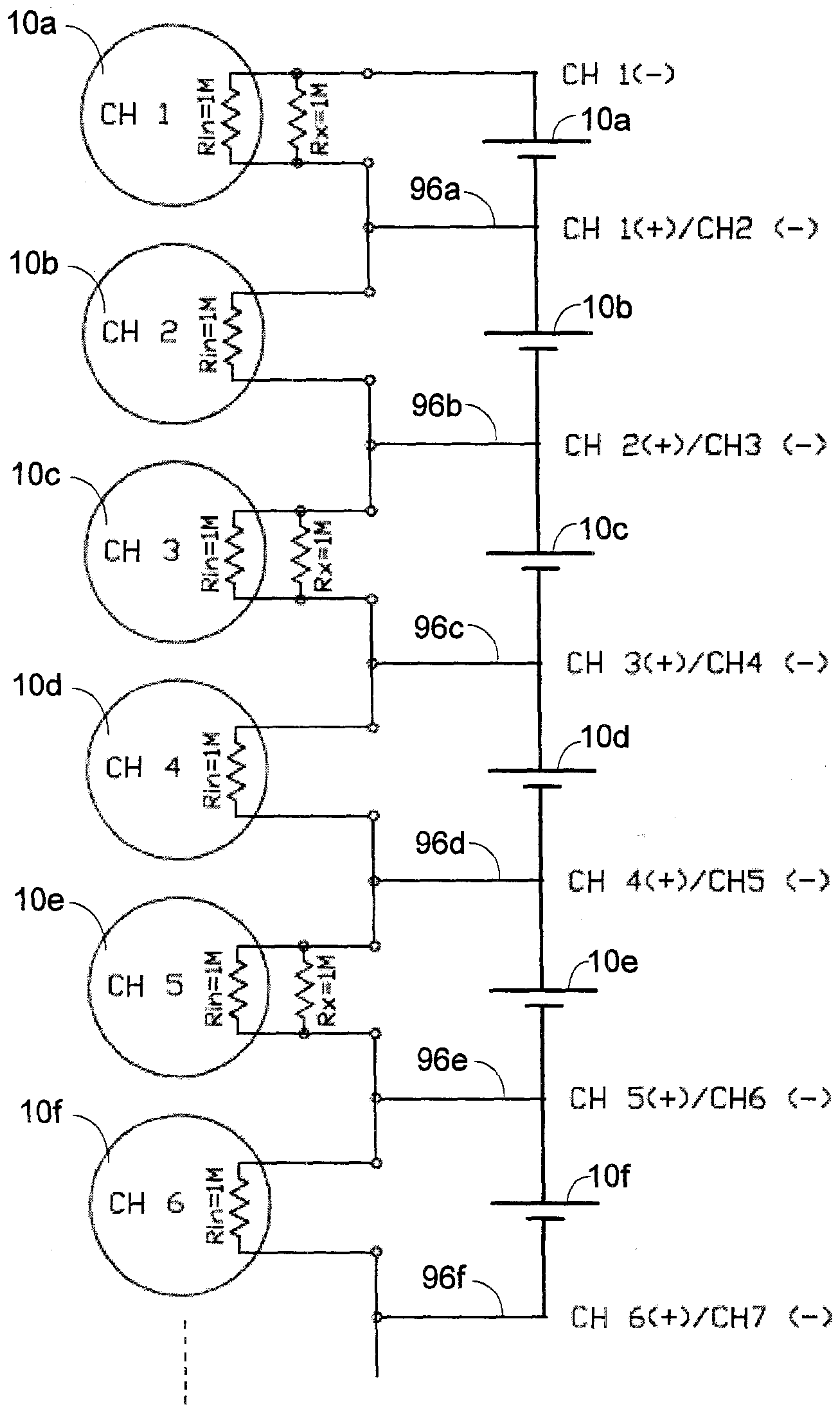
FIG. 10 is a schematic view depicting the placement of fault detection resistors on the back end board according to the embodiment of FIG. 1 to facilitate detection of open circuit faults.

Referring now to FIG. 10, there is depicted a schematic of a resistor array that can be used in conjunction with methods executed on the off-board processor 88 to determine whether there is an open circuit fault present in the system 1. FIG. 10 depicts six of the channels, channels 1 through 6 10*a-f*, daisy chained together and electrically coupled to a plurality of voltage sources 12*a-f*. In the depicted daisy chain configuration, the slot measurement connector 94 of each of the depicted slots 54 is electrically coupled to the slot reference connector 92 of an adjacent one of the slots 54. A plurality of traces are electrically coupled between the slots 54 and the voltage sources 12; the traces that connect the slot reference connector 92 of one of the channels 10 and the slot measurement connector 94 of an adjacent one of the channels 94 are hereinafter referred to as "intermediate traces". In FIG. 10, six intermediate traces 96*a-f* are depicted. The input impedance of each of the channels 10 is 1 MΩ. Every other one of the slots 54 has connected across its reference and measurement connectors 92, 94 another 1 MΩ resistor ("fault detection resistor"); three fault detection resistors 98*a-c* are depicted in FIG. 10. When all of the intermediate traces 96*a-f* electrically couple the channels 10 to the voltage sources 12*a -f*, each of the channels 10*a-f* can respectively measure the voltage of each of the voltage sources 12*a-f*. If one of the intermediate traces 96*a-f* breaks and becomes an open circuit ("broken intermediate trace"), the voltages measured by the channels 10 coupled to the broken intermediate trace become skewed such that a user monitoring voltage readings can easily conclude that an open circuit fault is present in the system 1.

For example, in an embodiment in which the voltage of each of the voltage sources 12*a-f* is 5.00 V, each of the channels 10*a-f* will measure a voltage of 5.00 V when there are no broken intermediate traces. However, if one of the intermediate traces 96*a* breaks, then (⅓)*(10)=3.33 V of the cumulative 10 V voltage generated by the voltage sources 12*a, b* will be measured by channel 1 10*a*, while the voltage measured by channel 2 10*b* will be (⅔)*(10)=6.67 V. In a system in which the expected deviation in any of the voltage sources 12 is much less than 1.67 V, such a voltage deviation immediately indicates to the user that the intermediate trace 96*a* has broken. Similarly, if two of the intermediate traces 96*a, b* break, then the voltages measured by channels 1 through 4 10*a, b, c, d* will respectively be 3.75 V, 7.50 V, 3.75 V, and 5.00 V.

For the sake of convenience, the exemplary embodiments above are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

FIG. 11 is a flowchart of an exemplary methods, and various other exemplary methods are also described in the foregoing description. Some of the actions illustrated in the flowchart and described in association with the foregoing exemplary methods may be performed in an order other than that which is described. Also, it should be appreciated that not all of the actions described in the flow chart and in the foregoing exemplary methods are required to be performed, that additional actions may be added, and that some of the illustrated or described actions may be substituted with other actions.

While particular example embodiments have been described in the foregoing, it is to be understood that other embodiments are possible and are intended to be included herein. It will be clear to any person skilled in the art that modifications of and adjustments to the foregoing example embodiments, not shown, are possible.

The invention claimed is:

1. A system for monitoring a plurality of voltage signals, the system comprising:

(a) a plurality of channels, at least one of the plurality of channels comprising:
  (i) a pair of terminals comprising a reference terminal and a measurement terminal, the voltage signal measurable at the measurement terminal relative to the reference terminal;
  (ii) voltage signal processing circuitry electrically coupled to the pair of terminals to receive and process the voltage signal, the voltage signal processing circuitry comprising a memory having encoded thereon channel identification information comprising at least one of an operating mode of the channel and a serial number of the channel; and
  (iii) an isolation block comprising an isolator having an input and an output that are electrically isolated from each other, the isolator input electrically coupled to the voltage signal processing circuitry to receive the voltage signal and the channel identification information and then to output the voltage signal and the channel identification information to the isolator output
(b) a back end board for monitoring the plurality of voltage signals, the back end board comprising:
  (i) a plurality of slots, each of the slots configured to be physically and electrically detachably coupled to one of the channels; and
  (ii) voltage sampling circuitry electrically coupled to the plurality of slots and configured to communicate with the plurality of channels such that the plurality of channels simultaneously sample the plurality of voltage signals.

2. A system as claimed in claim 1 wherein the voltage signal processing circuitry comprises:

(a) an analog-to-digital converter configured to digitize and then to output a digitized voltage signal; and
(b) a microprocessor electrically coupled to the analog-to-digital converter and the memory to receive the digitized voltage signal and the channel identification information, wherein the isolator input is electrically coupled to the microprocessor to receive the digitized voltage signal and the channel identification information and then to output the digitized voltage signal and the channel identification information to the isolator output.

3. A system as claimed in claim 2 wherein the microprocessor is configured to linearly correct for one or both of gain factor and offset errors in the digitized voltage signal and then to output a corrected voltage signal to the isolator input, and wherein the isolator outputs the corrected voltage signal to the isolator output.

4. A system as claimed in claim 3 wherein the microprocessor linearly corrects for errors in the digitized voltage signal by setting the corrected voltage signal to (the digitized voltage signal)*(the gain factor) +(the offset).

5. A system as claimed in claim 1 further comprising a current to voltage converter electrically coupled between the reference and measurement terminals, the voltage signal resulting from a current signal flowing through the current to voltage converter.

6. A system as claimed in claim 5 further comprising mode selection circuitry electrically coupled to the microprocessor and operable to indicate the operating mode, wherein the operating mode indicates whether the voltage signal results from the current signal flowing through the current to voltage converter.

7. A system as claimed in claim 6 wherein the operating mode further indicates an expected voltage range of the voltage signal.

8. A system as claimed in claim 6 wherein the operating mode further indicates whether the channel is configured to receive data transmitted using fully differential signalling.

9. A system as claimed in claim 6 wherein the mode selection circuitry comprises a voltage divider configurable to output different voltages each indicative of the operating mode of the channel.

10. A system as claimed in claim 2 further comprising an isolated power supply electrically coupled to the voltage signal processing circuitry and the isolation block, and wherein the voltage signal processing circuitry and the isolation block are powered with the isolated power supply.

11. A system as claimed in claim 10 wherein the isolated power supply comprises:

(a) a secondary winding of a transformer configured to be inductively coupled to a primary winding of the transformer, the secondary winding of the transformer configured to output a pulse train when the primary winding is electrically coupled to a voltage source outputting the pulse train;

(b) a voltage rectifier electrically coupled to the secondary winding and configured to rectify the pulse train and to output a direct-current signal;

(c) a voltage regulator electrically coupled to the voltage rectifier and to the voltage signal processing circuitry and configured to supply power to the voltage signal processing circuitry; and wherein the primary winding of the transformer is disposed on the back end board and is inductively coupled to the secondary winding of the transformer when the at least one of the plurality of channels is physically and electrically coupled into one of the plurality of slots.

12. A system as claimed in claim 11 further comprising a precision voltage reference electrically coupled to the voltage regulator, wherein the precision voltage reference outputs a first reference voltage used to bias the reference terminals.

13. A system as claimed in claim 12 wherein the microprocessor is configured to switch between the digitized voltage signal, the first reference voltage, and a second reference voltage, wherein the first reference voltage and the second reference voltage are known values, and wherein the microprocessor is configured to calculate the gain factor and offset by:

(a) measuring the first reference voltage to obtain a measured first reference voltage, wherein the measured first reference voltage equals the gain factor multiplied by the first reference voltage plus the offset;

(b) measuring the second reference voltage to obtain a measured second reference voltage, wherein the measured second reference voltage equals the gain factor multiplied by the second reference voltage plus the offset; and (c) solving for the gain factor and the offset using the measured reference voltages and the known values of the reference voltages.

14. A system as claimed in claim 1 wherein the voltage sampling circuitry comprises a field programmable gate array (FPGA).

15. A system as claimed in claim 2 wherein the voltage sampling circuitry comprises a FPGA and the back end board further comprises:

(a) a microcontroller electrically coupled to the FPGA and configured to receive the voltage signals from the FPGA, to condition the voltage signals such that they are suitable for network transmission, and to output the voltage signals; and (b) a network bus having an input and an output, the network bus input electrically coupled to the microcontroller and configured to receive the voltage signals from the microcontroller and to convey the voltage signals to the network bus output.

16. A system as claimed in claim 1 wherein each of the slots comprises electrically conductive reference and measurement connectors each respectively configured to electrically mate with the reference and measurement terminals of one of the channels, and wherein the measurement connector of one of the slots is electrically coupled to the reference connector of an adjacent slot that is adjacent to the one of the slots.

17. A system as claimed in claim 1 wherein the slots are socketized to facilitate coupling and removal of the channels from the board.

18. A system as claimed in claim 15 wherein the microcontroller is configured to mitigate non-linear errors in any one of the voltage signals by applying a quadratic correction formula to the voltage signal prior to outputting it to the network bus output.

19. A system as claimed in claim 15 further comprising an off-board processor electrically coupled to the network bus output, the off-board processor electrically coupled to an off-board memory having stored thereon statements and instructions for causing the off-board processor to execute a method comprising:

(a) obtaining the channel identification information for at least one of the channels;

(b) generating a current state manifest comprising a position of the at least one of the channels on the back end board and the channel identification information of the at least one of the channels.

20. A system as claimed in claim 19 wherein the method further comprises:

(a) associating, with the at least one of the channels, calibration data associated with the serial number of the at least one of the channels; and (b) utilizing the calibration data to mitigate errors in the voltage signals received from the at least one of the channels.

21. A system as claimed in claim 20 wherein the calibration data comprises a plurality of data points relating a listing of different digitized voltage signals to a listing of different first reference voltages, and wherein the method further comprises:

(a) determining an interpolated reference voltage to be used when measuring the voltage signal by:

(i) selecting two digitized voltage signals from the listing of different voltage signals that are closest to the digitized voltage signal; and (ii) determining the interpolated reference voltage from the different first reference voltages related to the two digitized voltage signals; and (b) determining the voltage signal using the interpolated reference voltage instead of the first reference voltage.

22. A system as claimed in claim 19 further comprising a display electrically coupled to the off-board processor and wherein the method further comprises:

(a) determining whether the current state manifest differs from a stored, previous state manifest;

(b) when the current state manifest differs from the previous state manifest, displaying a prompt on the display to determine whether the current state manifest is acceptable; and (c) when the current state manifest is acceptable, overwriting the stored, previous state manifest with the current state manifest.

23. A system as claimed in claim 19 further comprising a display electrically coupled to the off-board processor and wherein the method further comprises:

(a) determining when the current state manifest comprises an invalid arrangement of channels; and (b) when the current state manifest comprises the invalid arrangement of channels, displaying a warning on the display.

24. A system as claimed in claim 23 wherein the invalid arrangement of channels comprises one of the channels being electrically coupled to one of the slots and configured to receive data transmitted using fully differential signalling, and another one of the channels being electrically coupled to another slot that is adjacent to the one of the slots.

25. A system as claimed in claim 23 wherein the invalid arrangement of channels comprises one of the channels being electrically coupled to one of the slots and configured to measure voltage signals falling within a first voltage range, and another one of the channels being electrically coupled to another slot that is adjacent to the one of the slots and configured to measure voltage signals falling with a second voltage range that differs from the first voltage range.

26. A system as claimed in claim 15 further comprising a plurality of temperature sensors disposed on the back end board and electrically coupled to the microcontroller, and wherein the microcontroller linearly interpolates a temperature reading of a location on the back end board between the plurality of temperature sensors to perform cold junction compensation when the operating mode of the at least one of the plurality of channels is that of a thermocouple.

27. A method for monitoring a voltage signal, the method comprising:

(a) sampling the voltage signal using a channel;

(b) isolating and then outputting the voltage signal and channel identification information stored on the channel;

(c) processing the voltage signal in accordance with the channel identification information, the channel identification information comprising at least one of an operating mode of the channel and a serial number of the channel;

(d) digitizing the voltage signal to create a digitized voltage signal;

(e) linearly correcting for one or both of gain factor and offset errors in the digitized voltage signal and then outputting a corrected voltage signal;

(f) simultaneously sampling the corrected voltage signal and additional corrected voltage signals from additional channels using a field programmable gate array (FPGA);

(g) conditioning the corrected voltage signals such that they are suitable for network transmission; and (h) outputting the corrected voltage signals to a network bus.

28. A method for monitoring a voltage signal, the method comprising:

(a) sampling the voltage signal using a channel;

(b) isolating and then outputting the voltage signal and channel identification information stored on the channel;

(c) processing the voltage signal in accordance with the channel identification information, the channel identification information comprising at least one of an operating mode of the channel and a serial number of the channel;

(d) digitizing the voltage signal to create a digitized voltage signal;

(e) linearly correcting for one or both of gain factor and offset errors in the digitized voltage signal and then outputting a corrected voltage signal;

(f) associating, with the channel, calibration data associated with the serial number of the channel, wherein the calibration data comprises a plurality of data points relating a listing of different digitized voltage signals to a listing of different first reference voltages;

(g) utilizing the calibration data to mitigate errors in the digitized voltage signal;

(h) determining an interpolated reference voltage to be used when measuring the voltage signal by:

(i) selecting two digitized voltage signals from the listing of different voltage signals that are closest to the digitized voltage signal; and (ii) determining the interpolated reference voltage from the different first reference voltages related to the two digitized voltage signals; and (i) determining the voltage signal using the interpolated reference voltage instead of the first reference voltage.

29. A method for monitoring a voltage signal, the method comprising:

(a) sampling the voltage signal using a channel;

(b) isolating and then outputting the voltage signal and channel identification information stored on the channel;

(c) processing the voltage signal in accordance with the channel identification information, the channel identification information comprising at least one of an operating mode of the channel and a serial number of the channel;

(d) generating a current state manifest comprising a position of the channel and the channel identification information of the channel;

(e) determining whether the current state manifest differs from a stored, previous state manifest;

(f) when the current state manifest differs from the previous state manifest, displaying a prompt to determine whether the current state manifest is acceptable; and (g) when the current state manifest is acceptable, overwriting the stored, previous state manifest with the current state manifest.

30. A method for monitoring a voltage signal, the method comprising:

(a) sampling the voltage signal using a channel;

(b) isolating and then outputting the voltage signal and channel identification information stored on the channel;

(c) processing the voltage signal in accordance with the channel identification information, the channel identification information comprising at least one of an operating mode of the channel and a serial number of the channel;

(d) generating a current state manifest comprising a position of the channel and the channel identification information of the channel;

(e) determining when the current state manifest comprises an invalid arrangement of channels; and (f) when the current state manifest comprises the invalid arrangement of channels, displaying a warning.

31. A method as claimed in claim 30 wherein the invalid arrangement of channels comprises one of the channels being electrically coupled to one of the slots and configured to receive data transmitted using fully differential signalling, and another one of the channels being electrically coupled to another slot that is adjacent to the one of the slots.

32. A method as claimed in claim 30 wherein the invalid arrangement of channels comprises one of the channels being electrically coupled to one of the slots and configured to measure voltage signals falling within a first voltage range, and another one of the channels being electrically coupled to another slot that is adjacent to the one of the slots and configured to measure voltage signals falling with a second voltage range that differs from the first voltage range.

* * * * *